United States Patent
Koo et al.

(10) Patent No.: US 11,601,581 B2
(45) Date of Patent: Mar. 7, 2023

(54) ELECTRONIC APPARATUS AND CONTROL METHOD THEREOF

(71) Applicant: SAMSUNG ELECTRONICS CO., LTD., Suwon-si (KR)

(72) Inventors: Jaephil Koo, Suwon-si (KR); Donguk Kang, Suwon-si (KR); Seun Ryu, Suwon-si (KR); Sunghyun Jang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 298 days.

(21) Appl. No.: 16/718,315

(22) Filed: Dec. 18, 2019

(65) Prior Publication Data

US 2020/0195824 A1 Jun. 18, 2020

(30) Foreign Application Priority Data

Dec. 18, 2018 (KR) .......................... 10-2018-0164523

(51) Int. Cl.
*H04N 5/225* (2006.01)
*G02F 1/137* (2006.01)

(52) U.S. Cl.
CPC ........... *H04N 5/2259* (2013.01); *G02F 1/137* (2013.01); *H04N 5/2257* (2013.01)

(58) Field of Classification Search
CPC .... H04N 5/2259; H04N 5/2257; H04N 5/232; H04N 5/23299; H04N 5/2254;
(Continued)

(56) References Cited

U.S. PATENT DOCUMENTS 6,081,371 A * 6/2000 Shioda ............... G02B 21/0012
359/369
7,034,866 B1 4/2006 Colmenarez et al.
(Continued)

FOREIGN PATENT DOCUMENTS

CN 105355640 A 2/2016
CN 106707576 A 5/2017
(Continued)

OTHER PUBLICATIONS

Zeev Zalevsky, Ibrahim Abdulhalim, Integrated Nanophotonic Devices (Second Edition), (Year: 2014).*
(Continued)

*Primary Examiner* — Sinh Tran
*Assistant Examiner* — Zhenzhen Wu
(74) *Attorney, Agent, or Firm* — Sughrue Mion, PLLC

(57) ABSTRACT

Provided is an electronic apparatus including a panel device including a plurality of image display pixels and a plurality of image sensing elements, wherein each image sensing element is disposed between the plurality of image display pixels, an optical element disposed on an upper portion of the panel device, wherein the plurality of image sensing elements are configured to sense an incident light through the optical element, a viewing zone adjusting assembly configured to adjust a field of view (FOV) of the plurality of image sensing elements, and a processor configured to control the viewing zone adjusting assembly to adjust the FOV of at least one image sensing element, and control the panel device to display an image generated based on the sensed incident light.

6 Claims, 35 Drawing Sheets

(58) Field of Classification Search
CPC ........ G02F 1/137; G02F 1/294; G02F 1/1313; G02F 1/29; H01L 27/14609; H01L 27/14627; H01L 27/14625; G09G 3/36; G09G 2300/0408; G09G 2300/0439
See application file for complete search history.

(56) References Cited

U.S. PATENT DOCUMENTS

| | | | |
|---|---|---|---|
| 7,535,468 | B2 | 5/2009 | Uy |
| 8,223,277 | B2 | 7/2012 | Ohtoshi et al. |
| 9,057,931 | B1 | 6/2015 | Baldwin |
| 9,185,397 | B2 | 11/2015 | Kim et al. |
| 9,494,825 | B2 | 11/2016 | Choi et al. |
| 9,507,412 | B2 | 11/2016 | Herold et al. |
| 10,209,543 | B2 | 2/2019 | Li et al. |
| 10,412,349 | B2 | 9/2019 | Hwang et al. |
| 10,623,697 | B2 | 4/2020 | Guo et al. |
| 2006/0007222 | A1* | 1/2006 | Uy .................. H01L 27/14603 345/207 |
| 2010/0194854 | A1* | 8/2010 | Kroll .................. G03H 1/02 348/40 |
| 2011/0007048 | A1 | 1/2011 | Fratti et al. |
| 2012/0075569 | A1* | 3/2012 | Chang .................. G02F 1/29 349/200 |
| 2014/0145939 | A1* | 5/2014 | Herold .................. G02B 27/017 345/156 |
| 2014/0354597 | A1* | 12/2014 | Kitchens, II .............. G06F 3/02 345/175 |
| 2016/0255328 | A1 | 9/2016 | Fattal et al. |
| 2017/0139250 | A1 | 5/2017 | Li et al. |
| 2017/0140702 | A1 | 5/2017 | Li et al. |
| 2017/0219859 | A1* | 8/2017 | Christophy ........... G02F 1/1336 |
| 2018/0068424 | A1 | 3/2018 | Kwon et al. |
| 2018/0352199 | A1 | 12/2018 | Hwang et al. |
| 2021/0364882 | A1* | 11/2021 | Yan .................. G02F 1/294 |

FOREIGN PATENT DOCUMENTS

| | | | |
|---|---|---|---|
| EP | 3 168 720 | A1 | 5/2017 |
| JP | 2003-332546 | A | 11/2003 |
| JP | 2003332546 | A * | 11/2003 |
| JP | 3140079 | U | 3/2008 |
| JP | 2013-201466 | A | 10/2013 |
| KR | 10-0835841 | B1 | 6/2008 |
| KR | 101322982 | B1 | 10/2013 |
| KR | 10-1483025 | B1 | 1/2015 |
| KR | 10-2015-0069588 | A | 6/2015 |
| KR | 10-2016-0043216 | A | 4/2016 |
| KR | 10-2018-0133157 | A | 12/2018 |
| WO | 2009139760 | A1 | 11/2009 |

OTHER PUBLICATIONS

Complete Guide To Image Sensor Pixel Size, https://www.ephotozine.com/article/complete-guide-to-image-sensor-pixel-size-29652 (Year: 2016).*
Communication dated Feb. 19, 2020 issued by the Korean Intellectual Property Office in counterpart Korean Application No. 10-2018-0164523.
International Search Report dated Apr. 14, 2020 issued by the International Searching Authority in counterpart International Application No. PCT/KR2019/017852 (PCT/ISA/210).
Written Opinion dated Apr. 14, 2020 issued by the International Searching Authority in counterpart International Application No. PCT/KR2019/017852 (PCT/ISA/237).
Communication dated Nov. 18, 2021 issued by the European Patent Office in application No. 19900857.4.
Brown, C., et al., "A 2.6 inch VGA LCD with Optical Input Function using a 1-Transistor Active-Pixel Sensor", ISSCC 2007, Digest of Technical Papers, XP031111137, pp. 132-133; 592.
Communication dated Jun. 20, 2022, issued by the China National Intellectual Property Administration in counterpart Chinese Application No. 201980083777.X.

* cited by examiner

ELECTRONIC APPARATUS AND CONTROL METHOD THEREOF

CROSS-REFERENCE TO RELATED APPLICATION

This application is based on and claims priority under 35 U.S.C. § 119 to Korean Patent Application No. 10-2018-0164523, filed on Dec. 18, 2018, in the Korean Intellectual Property Office, the disclosure of which is incorporated by reference herein in its entirety.

BACKGROUND

1. Field

This disclosure relates to an electronic apparatus and a control method thereof, and more particularly, to an electronic apparatus including an image sensing element and a control method thereof.

2. Description of the Related Art

In accordance with the development of electronic technology, various types of electronic devices have been developed and distributed. In particular, display devices used in various places such as homes, offices, public places, and the like have been continuously developed in recent years.

Recently, a display device that allows a user to perform various interactions while viewing the user's own appearance on a screen has been provided.

For example, an image self-photographed by a smartphone may be displayed on a screen. In this case, due to a camera located mostly on the top of the smartphone, a gaze mismatch problem in which the gaze of the user looking at the smartphone is directed toward the front display of the smartphone, where the gaze of the user on the screen looks downwards on the display. In addition, there is a problem that a space for a camera arrangement on the top of the smartphone is required, causing a limitation in implementing a bezel-less full screen display.

SUMMARY OF THE INVENTION

Provided are an electronic apparatus and a control method thereof, and more particularly, an electronic apparatus including an image sensing element and a control method.

Additional aspects will be set forth in part in the description which follows and, in part, will be apparent from the description, or may be learned by practice of the presented embodiments.

In accordance with an aspect of the disclosure an electronic apparatus includes a panel device including a plurality of image display pixels and a plurality of image sensing elements, wherein each image sensing element is disposed between the plurality of image display pixels, an optical element disposed on an upper portion of the panel device, wherein the plurality of image sensing elements are configured to sense an incident light through the optical element, a viewing zone adjusting assembly configured to adjust a field of view (FOV) of the plurality of image sensing elements, and a processor configured to control the viewing zone adjusting assembly to adjust the FOV of at least one image sensing element, and control the panel device to display an image generated based on the sensed incident light.

The plurality of image display pixels may be disposed in a two-dimensional array, wherein each of the plurality of image sensing elements are disposed between each of the plurality of image display pixels, respectively, in a two-dimensional array, and wherein each of the plurality of image sensing elements is disposed on a same layer as the plurality of image display pixels or disposed on a different layer from the plurality of image display pixels.

The viewing zone adjusting assembly may include a liquid crystal shutter disposed on or below the optical element, the liquid crystal shutter including a plurality of cells having a smaller size than that of the plurality of image sensing element, and the processor may be further configured to control an opening or closing operation of each of the plurality of cells by controlling whether or not a voltage is applied to each of the plurality of cells included in the liquid crystal shutter.

The processor may be further configured to adjust a FOV of a display by adjusting at least one of an opening position or an opening size of the corresponding liquid crystal shutter based on an arrangement position of each of optical lenses included in the optical element.

The processor may be further configured to control the opening or closing operation of each of the plurality of cells such that light is incident from the liquid crystal shutter corresponding to at least one sensing element disposed in an outer region to at least one cell region located at a first position, when the FOV of the display is enlarged, and control the opening or closing operation of each of the plurality of cells such that the light is incident from the liquid crystal shutter corresponding to at least one sensing element disposed in the outer region to at least one cell region located at a second position, when the FOV of the display is reduced, the second position being different from the first position.

The optical element may include a plurality of liquid crystal lenses including liquid crystals, wherein the viewing zone adjusting assembly may include a voltage applier configured to apply a voltage to the optical element, wherein the processor may be further configured to control the voltage applier to apply different voltages to each of the plurality of liquid crystal lenses based on arrangement positions of the plurality of liquid crystal lenses, and wherein an angle of an alignment of the liquid crystals may change based on an intensity of the voltage applied.

The optical element may be configured to disperse light emitted from the plurality of image display pixels.

The processor may be further configured to perform time division driving such that the plurality of image sensing elements are not driven during a first period in which the plurality of image display pixels are driven, and the plurality of image display pixels are not driven during a second period in which the plurality of image sensing elements are driven.

The processor may be further configured to process a plurality of images based on a FOV of each of the plurality of images acquired from the plurality of image sensing elements to obtain an output image to be displayed on the plurality of image display pixels.

The processor may be further configured to control the viewing zone adjusting assembly to differently adjust the FOV of the plurality of image sensing elements disposed at different arrangement positions based on a user command.

The processor may control the viewing zone adjusting assembly to adjust the FOV of the at least one image sensing element based on a distance of the at least one image sensing element with respect to a center of the panel device.

The processor may increase the FOV of the at least one image sensing element as the distance with respect to the center of the panel device of the at least one image sensing element increases.

Each of the plurality of image sensing elements may be a single sensing element or a two-dimensional sensing element of a macro pixel form.

In accordance with another aspect of the disclosure a control method of an electronic apparatus including a panel device including a plurality of image display pixels and a plurality of image sensing elements, wherein each image sensing element is disposed between the plurality of image display pixels, an optical element disposed on an upper portion of the panel device, wherein the plurality of image sensing elements are configured to sense an incident light through the optical element, and a viewing zone adjusting assembly configured to adjust a field of view (FOV) of the plurality of image sensing elements, includes controlling the viewing zone adjusting assembly to adjust a FOV of at least one image sensing element, and control the panel device to display an image generated based on the sensed incident light.

The plurality of image display pixels may be disposed in a two-dimensional array, wherein each of the plurality of image sensing elements are disposed between each of the plurality of image display pixels, respectively in a two-dimensional array, and wherein each of the plurality of image sensing elements is disposed on a same layer as the plurality of image display pixels or disposed on a different layer from the plurality of image display pixels.

The viewing zone adjusting assembly includes a liquid crystal shutter may be disposed on or below the optical element, the liquid crystal shutter including a plurality of cells having a smaller size than the plurality of image sensing element, wherein in the controlling of the viewing zone adjusting assembly, an opening or closing operation of each of the plurality of cells is controlled by controlling whether or not a voltage is applied to each of the plurality of cells constituting the liquid crystal shutter.

In the controlling of the viewing zone adjusting assembly, a FOV of a display may be adjusted by adjusting at least one of an opening position or an opening size of the corresponding liquid crystal shutter based on an arrangement position of each of the optical lenses included in the optical element.

In the controlling of the viewing zone adjusting assembly, the opening or closing operation of each of the plurality of cells is controlled such that light is incident from the liquid crystal shutter corresponding to at least one sensing element disposed in an outer region to at least one cell region located at a first position, when the FOV of the display is enlarged, and the opening or closing operation of each of the plurality of cells is controlled such that the light is incident from the liquid crystal shutter corresponding to at least one sensing element disposed in the outer region to at least one cell region located at a second position, when the FOV of the display is reduced, the second position being different from the first position.

The optical element may include a plurality of liquid crystal lenses including liquid crystals, wherein the viewing zone adjusting assembly includes a voltage applier configured to apply a voltage to the optical element, and wherein in the controlling of the viewing zone adjusting assembly, the voltage applier is controlled to apply different voltages to each of the plurality of liquid crystal lenses based on arrangement positions of the plurality of liquid crystal lenses, and wherein an angle of an alignment of the liquid crystals change based on an intensity of the voltage applied.

In the controlling of the viewing zone adjusting assembly, time division driving may be performed such that the plurality of image sensing elements are not driven during a first period in which the plurality of image display pixels are driven, and the plurality of image display pixels are not driven during a second period in which the plurality of image sensing elements are driven.

BRIEF DESCRIPTION OF THE DRAWINGS

The above and/or other aspects of the disclosure will be more apparent by describing embodiments of the present disclosure with reference to the accompanying drawings, in which.

DETAILED DESCRIPTION OF THE EXEMPLARY EMBODIMENTS

Figure 1A:
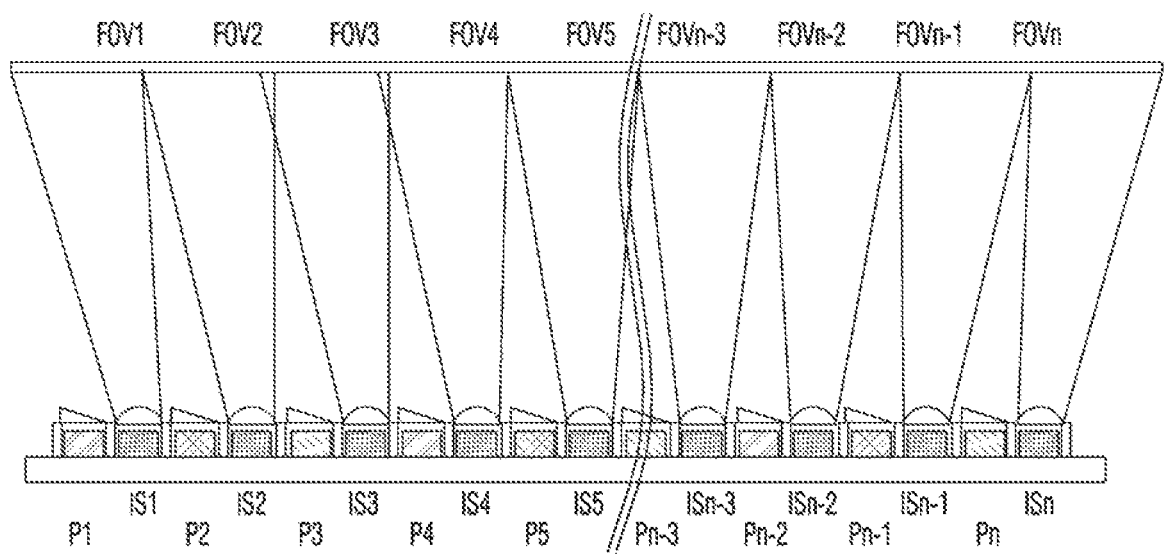
FIG. 1A is a view illustrating implementation of a display according to an embodiment of the disclosure.

Hereinafter, the disclosure will be described in detail with reference to the accompanying drawings.

The disclosure provides an electronic apparatus that reduces or prevents a gaze mismatch problem by including a plurality of image sensing elements in a panel device and provides a photographed image suitable for user interaction by adjusting field of views (FOVs) of the plurality of image sensing devices, and a control method thereof.

General terms that are currently widely used were selected as terms used in embodiments of the disclosure in consideration of functions in the disclosure, but may be changed depending on the intention of those skilled in the art or a judicial precedent, an emergence of a new technique, and the like. In addition, in a specific case, terms arbitrarily chosen by an applicant may exist. In this case, the meaning of such terms will be mentioned in detail in a corresponding description portion of the disclosure. Therefore, the terms used in the disclosure should be defined on the basis of the meaning of the terms and the contents throughout the disclosure rather than simple names of the terms.

Embodiments of the disclosure may apply various modifications and have various embodiments, and specific embodiments will be illustrated in the drawings and described in detail in the detail description. However, this is not intended to limit the scope to the specific embodiment, and it should be understood to include all modifications, equivalents, and substitutes included in the scope of the disclosed spirit and technology. In describing the embodiments, when it is determined that the detailed description of the related known technology may obscure the gist, the detailed description thereof will be omitted.

Terms 'first', 'second', and the like may be used to describe various components, but the components should not be limited by the terms. The terms are used only to distinguish one component from another component.

Singular expressions include plural expressions unless the context clearly indicates otherwise. It should be further understood that terms "include" or "constituted" used in the application specify the presence of features, numerals, steps, operations, components, parts mentioned in the specification, or combinations thereof, but do not preclude the presence or addition of one or more other features, numerals, steps, operations, components, parts, or combinations thereof.

The expression "at least one of A and B" should be understood to represent either "A" or "B" or any one of "A and B".

In the disclosure, a 'module' or a '~er/~' of may perform at least one function or operation, and be implemented by hardware or software or be implemented by a combination of hardware and software. In addition, a plurality of 'modules' or a plurality of '~ers/ors' may be integrated in at least one module and be implemented as at least one processor (not illustrated) except for a 'module' or an '~er/or' that needs to be implemented by specific hardware.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, embodiments of the disclosure will be described in detail with reference to the accompanying drawings so that those skilled in the art to which the disclosure pertains may easily practice the disclosure. However, the disclosure may be implemented in various different forms and is not limited to the embodiments described herein. In addition, in the drawings, portions unrelated to the description will be omitted to obviously describe the disclosure, and similar portions will be denoted by similar reference numerals throughout the specification.

Figure 1B:
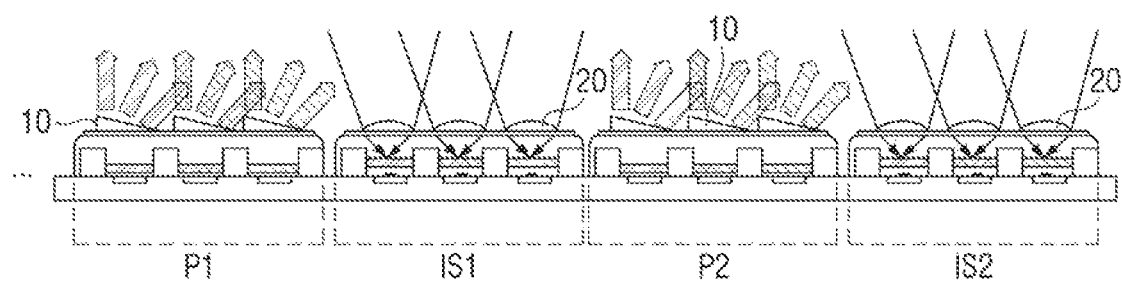
FIG. 1B is a view illustrating an operation of the display according to an embodiment.

FIGS. 1A and 1B are views illustrating implementations of an electronic apparatus according to an embodiment.

As illustrated in FIG. 1A, an electronic apparatus according to an embodiment may include a display including a plurality of image display pixels (display pixels) P and a plurality of image sensing elements IS. Here, the image display pixels may include all self-light emitting elements such as organic light emitting diodes (OLEDs), light-emitting diodes (LEDs), and micro LEDs, and transmissive elements such as liquid crystal displays (LCDs). In addition, the image sensing element may include all elements using a photoelectric effect such as a photo diode, a complementary metal-oxide semiconductor (CMOS), a charge-coupled device (CCD), and the like. The image sensing element may be implemented as a single sensing element (or a single pixel element) or as a two-dimensional sensing element in the form of a macro pixel.

According to an embodiment, each of the plurality of image sensing elements may be disposed in units of at least one image display pixel. Here, "at least one" may mean one or two or more. For example, the image display pixels and the image sensing elements may be alternately disposed at a ratio of 1:1, or may be disposed at a ratio of n:1 (n>1). In addition, the plurality of image display pixels may be arranged in a two-dimensional form, and the plurality of image sensing elements may be arranged in a two-dimensional form in units of at least one image display pixel. In this case, each of the plurality of image sensing elements may be disposed on the same layer (e.g., the same sheet) as at least one image display pixel, or may be disposed on a layer (e.g., a different sheet) different from at least one image display pixel. As an example, all of the plurality of image display pixels may be disposed on the same layer, and all of the plurality of image sensing elements may be disposed on the same layer as or layers different from the plurality of image display pixels. As another example, all of the plurality of image display pixels may be disposed on the same layer, at least some of the plurality of image sensing elements may be disposed on the same layer as the plurality of image display pixels, and the rest of the plurality of image sensing elements may be disposed on layers different from the plurality of image display pixels.

According to an embodiment, the image display pixel P is configured to emit light and the image sensing element IS is configured to collect light, as illustrated in FIGS. 1A and 1B. In this case, an optical element 10 for dispersing light may be disposed on the image display pixel P, and an optical element 20 for collecting light incident from a specific viewing zone may be disposed on the image sensing element IS. For example, the optical element 10 for dispersing light may include a prism or various types of diffused optical systems, and may be implemented in the form of one or more optical films or optical sheets. The optical element 20 for collecting light may include a micro-lens array, a lenticular lens, or another type of small lens array. Here, the optical element 20 for collecting light may be constituted by at least one optical sheet capable of adjusting a focal length. In addition, the optical element 20 for collecting light may include a liquid crystal panel capable of transmitting, shielding, or refracting light through electrical signal control.

Figure 2A:
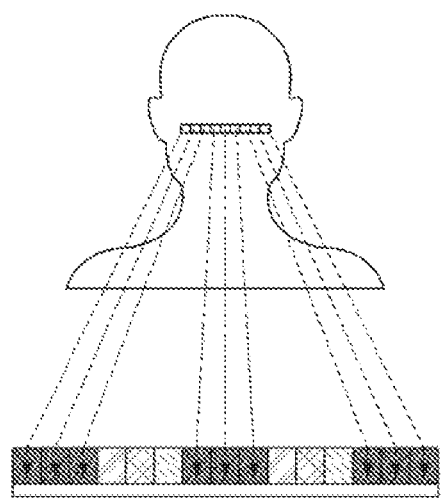
FIG. 2A is a view illustrating a photographing mode of an electronic apparatus according to an embodiment.
Figure 2B:
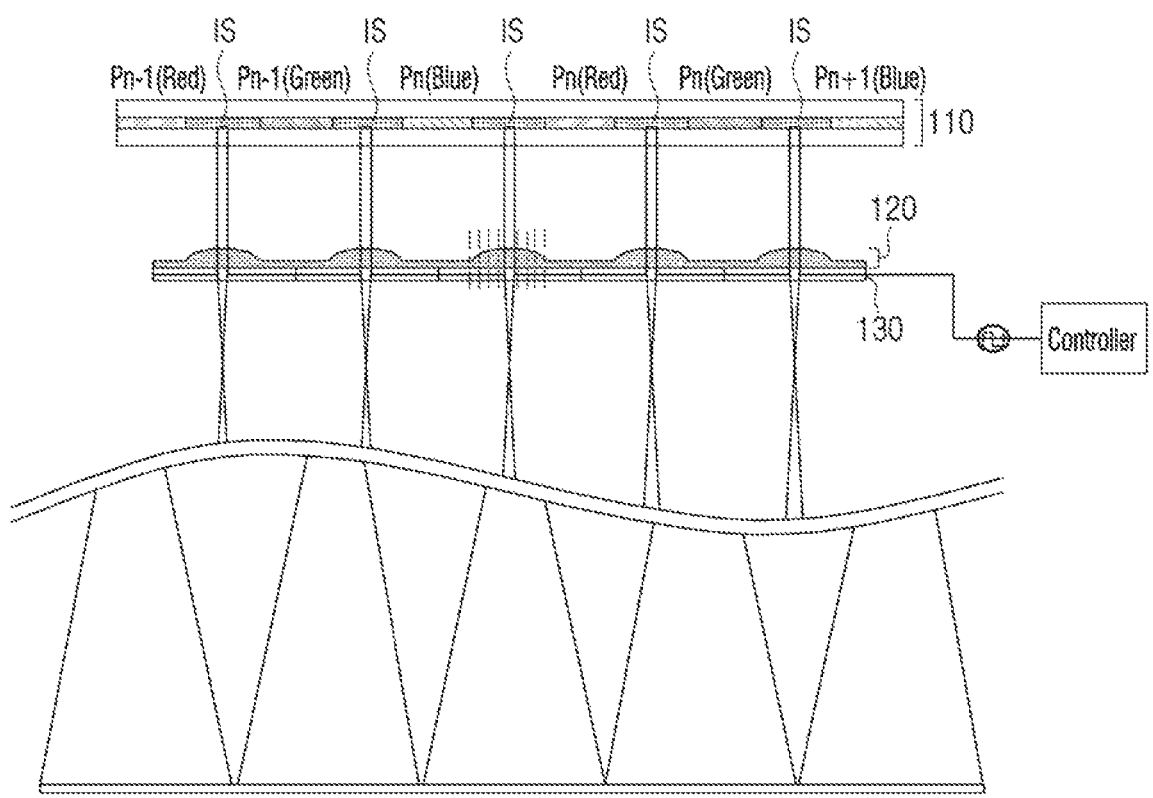
FIG. 2B is a view illustrating a photographing mode of an electronic apparatus according to an embodiment.

FIGS. 2A and 2B are views illustrating a photographing mode of an electronic apparatus according to an embodiment.

A display according to an embodiment may provide a photographing mode of collecting light incident from a specific viewing zone through the image sensing elements to acquire an image, as illustrated in FIG. 2A.

For example, as illustrated in FIG. 2B, the display may include a panel device 110, an optical element 120, and a viewing zone adjusting assembly 130. Light incident from the outside may be projected to the image sensing elements IS provided in the panel device 110 through the optical element 120, and the image sensing elements IS may acquire the image based on the projected signal. Here, the optical element 120 may include an optical lens, for example, a micro-lens array, a lenticular lens, or another type of small lens array. In this case, the viewing zone adjusting assembly 130 performs a function of adjusting the FOVs of the image sensing elements, which will be described in detail later.

Figure 2C:
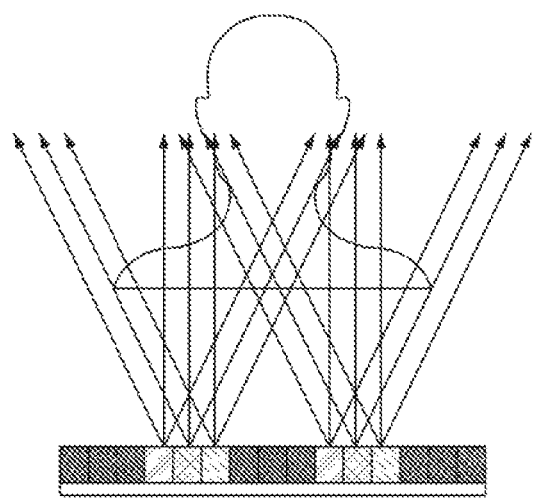
FIG. 2C is a view illustrating a display mode of the electronic apparatus according to an embodiment.
Figure 2D:
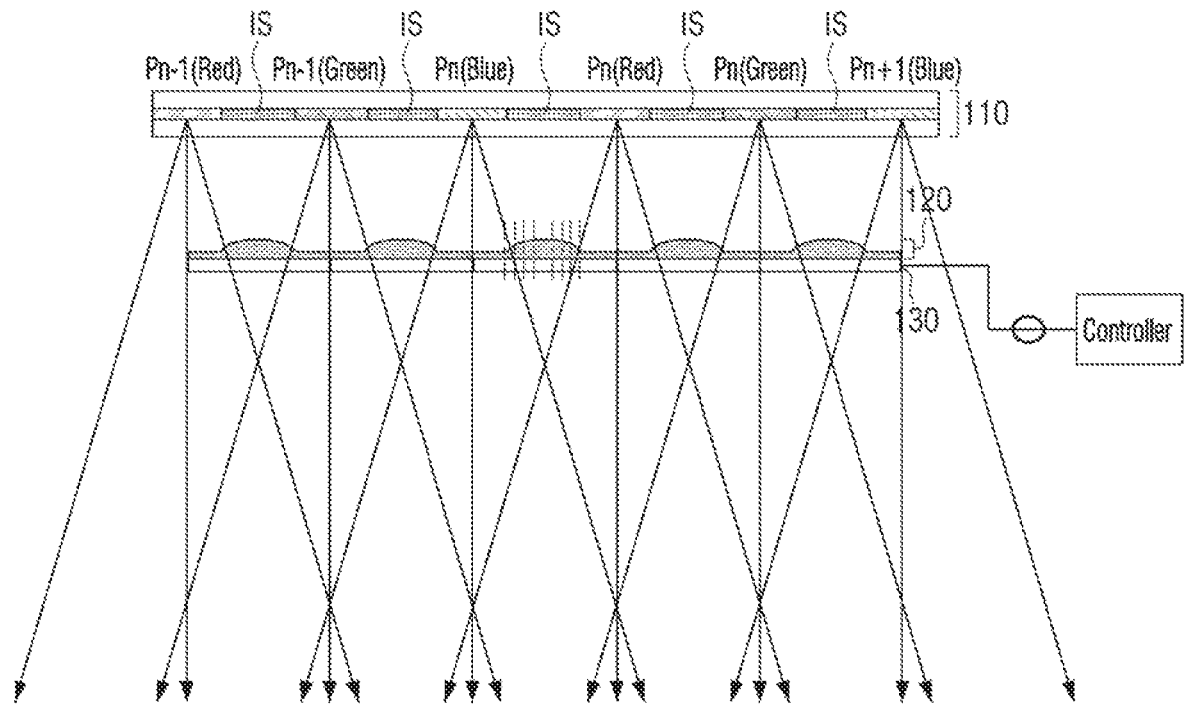
FIG. 2D is a view illustrating a display mode of the electronic apparatus according to an embodiment.

FIGS. 2C and 2D are views illustrating a display mode of the electronic apparatus according to an embodiment.

The display according to an embodiment may provide a display mode for displaying an image by diffusing light from the image display pixels to a specific viewing zone, as illustrated in FIG. 2C.

For example, as illustrated in FIG. 2D, the image signal acquired by the image sensing elements IS may be provided to the image display pixels P, and as a result, the image display pixels P may display the image.

FIGS. 3A to 3D are views illustrating an image acquired based on the FOV of the image sensing element.

As illustrated in FIG. 1A, each of the plurality of image sensing elements IS has a specific field of view (FOV). That is, as a first image sensing element IS1 has a first FOV (FOV1) and a second image sensing element IS2 has a second FOV (FOV2), the first image sensing element IS1 and the second image sensing element IS2 have viewing zones corresponding to each other.

Figure 3A:
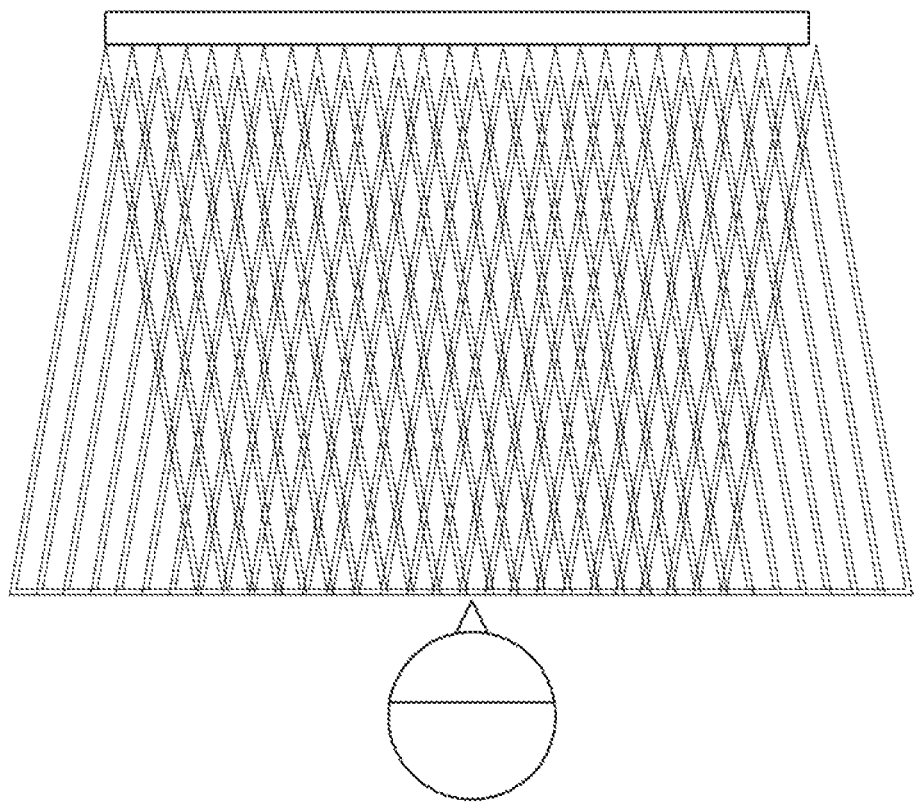
FIG. 3A is a view illustrating a case in which a field of view (FOV) of an image sensing element is expanded according to an embodiment.
Figure 3B:
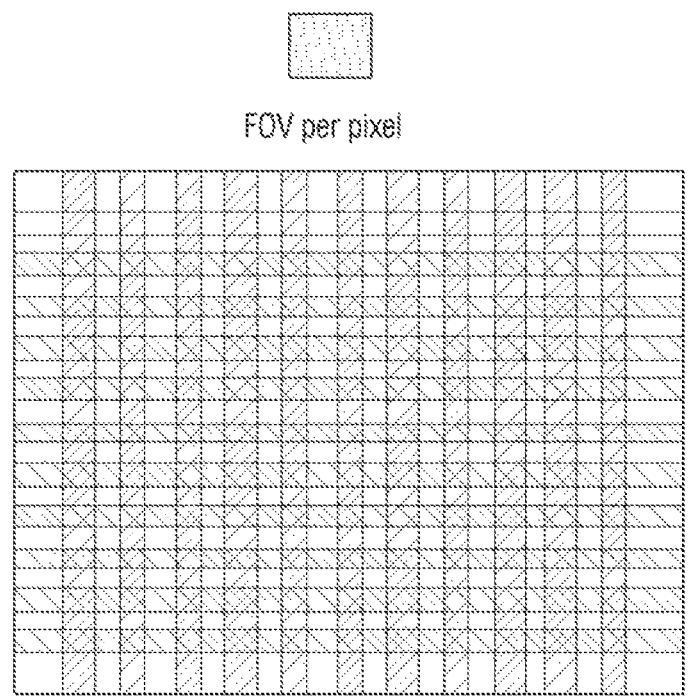
FIG. 3B is a view illustrating an image acquired in the case of FIG. 3A.
Figure 3C:
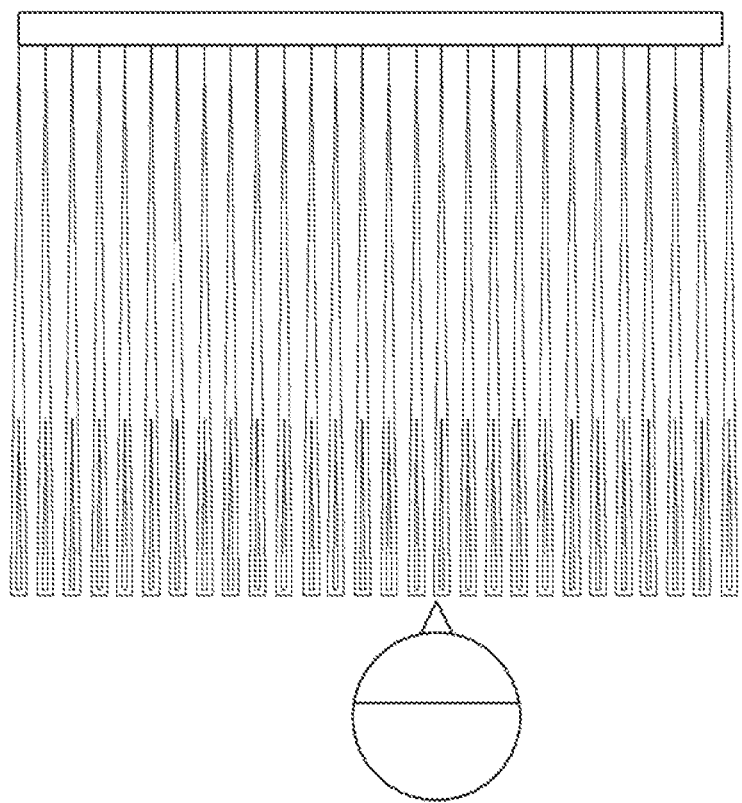
FIG. 3C is a view illustrating a case in which the FOV of the image sensing element is reduced according to an embodiment.
Figure 3D:
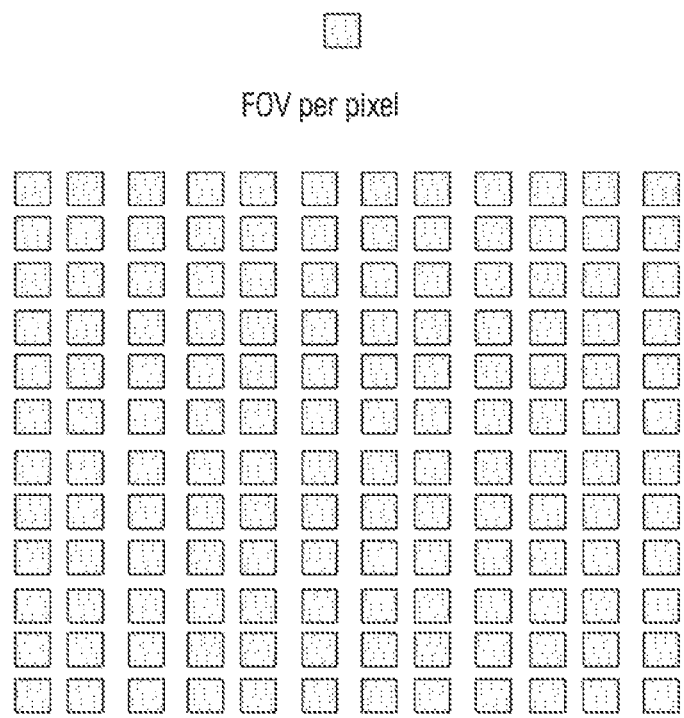
FIG. 3D is a view illustrating an image acquired in the case of FIG. 3C.

In this case, as illustrated in FIG. 3A, when the FOV of each image sensing element is relatively wide, the FOV of each image sensing element overlaps, and accordingly, the acquired image may be a blurry image due to a blurring phenomenon as illustrated in FIG. 3B. In addition, as illustrated in FIG. 3C, when the FOV of each image sensing element is narrow, a phenomenon such as dot or block artifact occurs in the acquired image as illustrated in FIG. 3D.

Accordingly, hereinafter, various embodiments of adjusting the FOV of at least one image sensing element based on various user contexts or the context of the electronic apparatus, and further adjusting the FOV of the display will be described.

Figure 4:
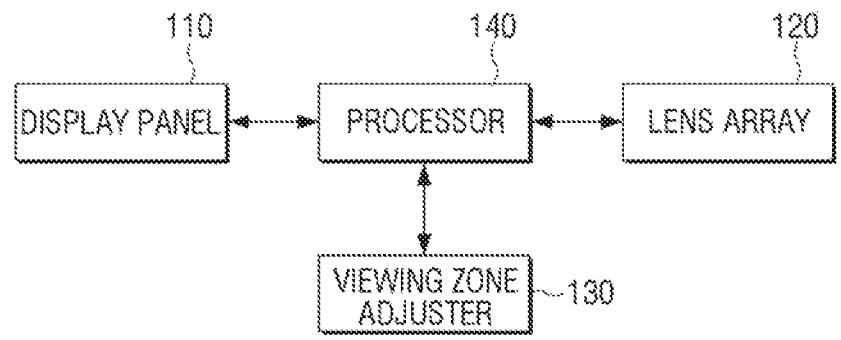
FIG. 4 is a block diagram illustrating a configuration of an electronic apparatus according to an embodiment.

FIG. 4 is a block diagram illustrating a configuration of an electronic apparatus according to an embodiment.

Referring to FIG. 4, the electronic apparatus 100 includes a panel device 110, an optical element 120, a viewing zone adjusting assembly 130, and a processor 140.

The electronic apparatus 100 may be implemented as a television (TV), a smartphone, or the like, but is not limited thereto, and may be applied without limitation to an apparatus having a display function and a photographing function, such as a tablet PC, a notebook PC, a large format display (LFD), a digital signage, a digital information display (DID), a video wall, a kiosk, or the like.

The panel device 110 may be implemented as various display units such as a liquid crystal display (LCD) panel, a light-emitting diode (LED), a micro LED, an organic light emitting diode (OLED), a vacuum fluorescent display (VFD), a field emission display (FED), an electro luminescence display (ELD), a plasma panel device (PDP), and the like.

The panel device 110 may include the plurality of image display pixels P and the plurality of image sensing elements IS. Here, each image sensing element may be disposed between the plurality of image display pixels as described in FIGS. 1A to 3B. Here, the image display pixels P may include any self-light emitting elements such as organic light emitting diodes (OLEDs), light-emitting diodes (LEDs), and micro LEDs, and transmissive elements such as liquid crystal displays (LCDs). For example, each of the image display pixels P may include a plurality of sub-pixels, and the plurality of sub-pixels may be constituted by red (R), green (G), and blue (B). That is, the pixel constituted by R, G, and B sub-pixels may be arranged in a plurality of row and column directions, that is, disposed in a matrix form to constitute the panel device 110.

In addition, the image sensing element IS may include any elements using a photoelectric effect such as a photo diode, a complementary metal-oxide semiconductor (CMOS), a charge-coupled device (CCD), and the like. The image sensing element IS may be implemented as a single sensing element (or a single pixel element) or as a two-dimensional sensing element in the form of a macro pixel.

Figure 5A:
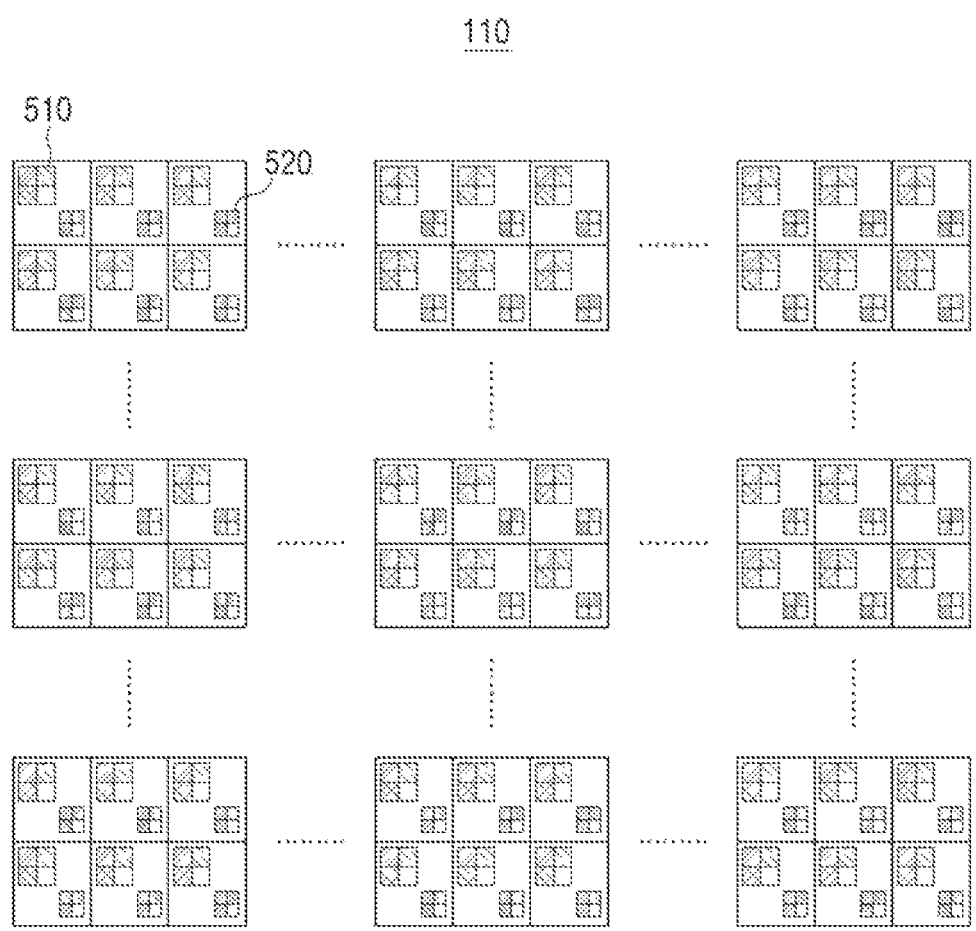
FIG. 5A is a view illustrating a form of one implementation of a panel device according to an embodiment.
Figure 5B:
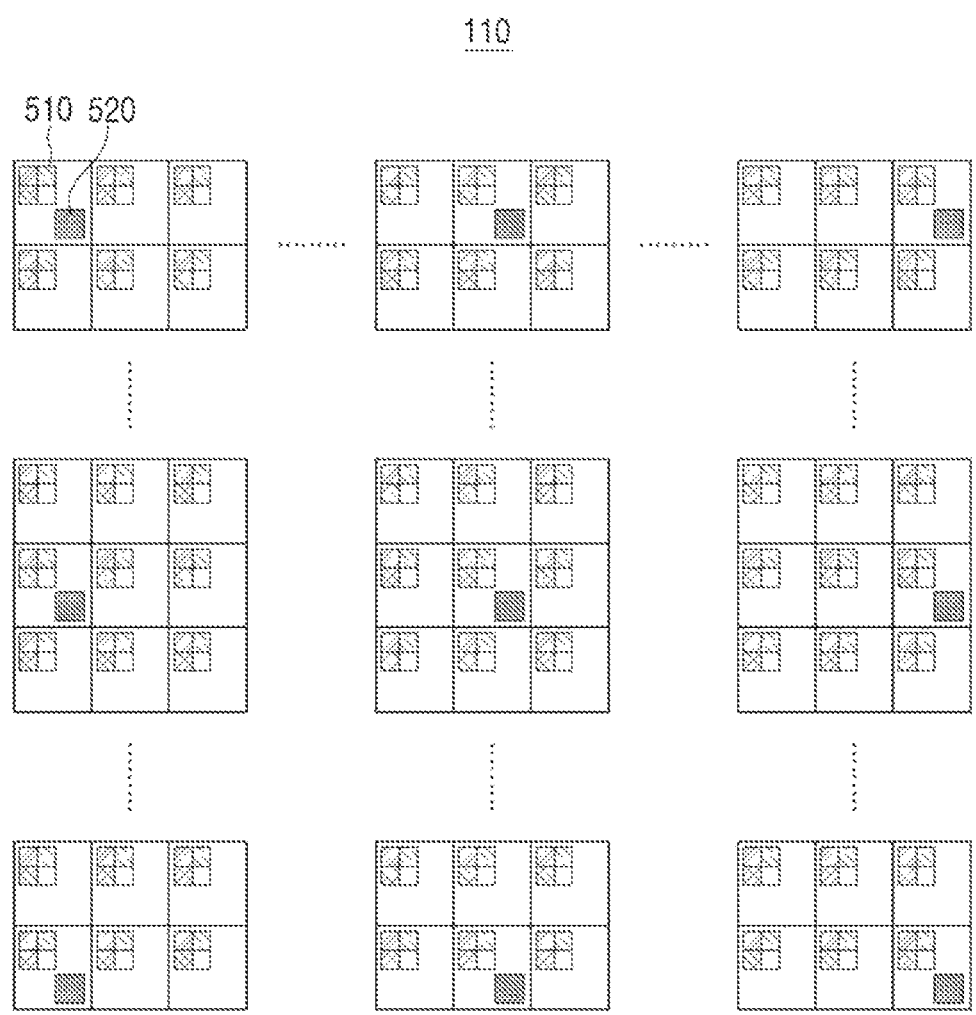
FIG. 5B is a view illustrating a form of another implementation of the panel device according to an embodiment.

FIGS. 5A and 5B are views illustrating a form of implementation of the display according to an embodiment.

According to an embodiment, the display 110 may have a form in which an image display pixel 510 and an image sensing element 520 are disposed at a ratio of 1:1 as illustrated in FIG. 5A. For example, the image display pixel 510 and the image sensing element 520 may be alternately disposed as illustrated. Here, the image sensing element 520 may be a single sensing element (or a single pixel element), but is not limited thereto. For example, the image sensing element 520 may also be implemented as a plurality of pixel elements.

According to another embodiment, the display 110 may have a form in which the image display pixel 510 and the image sensing element 520 are disposed at a ratio of n:1 as illustrated in FIG. 5B. For example, the image sensing element 520 may be disposed between a plurality of image display pixels 510 as illustrated. Here, the image sensing element 520 may be implemented as a plurality of pixel elements, for example, two-dimensional sensing elements in the form of macro pixels. However, the image sensing element 520 is not limited thereto. For example, when the form in which the image display pixel 510 and the image sensing element 520 are disposed at the ratio of n:1, the image sensing element 520 may be implemented as a single sensing element (or a single pixel element).

Figure 6A:
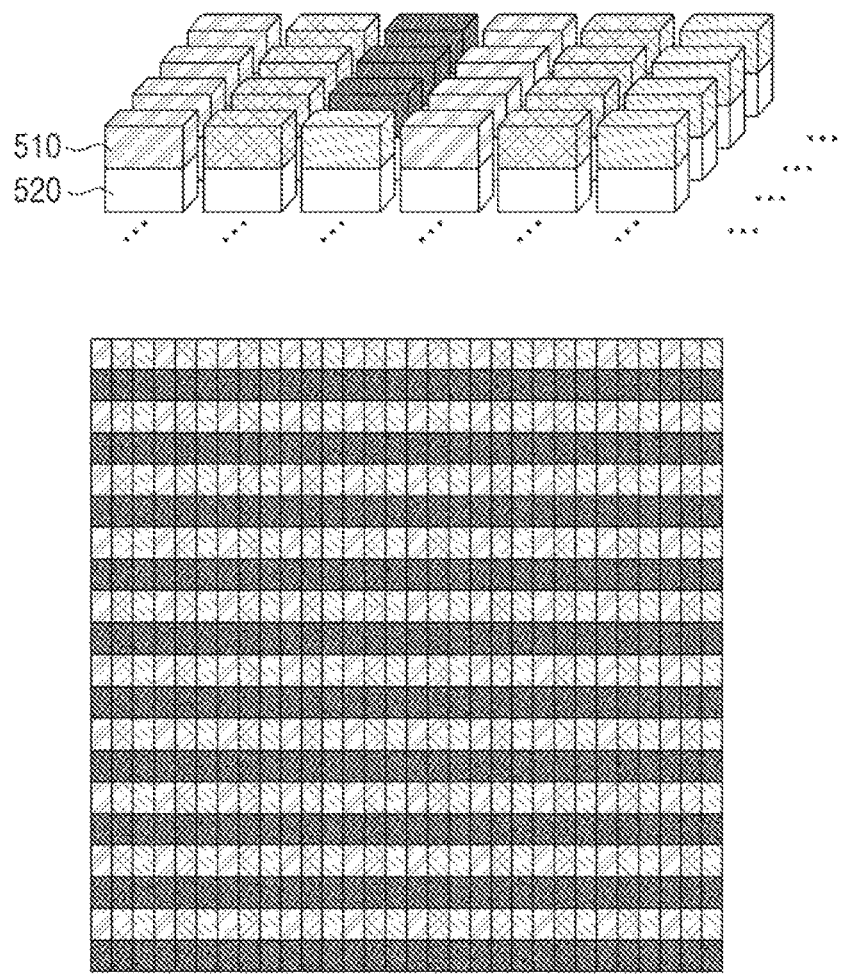
FIG. 6A is a view illustrating a form of one implementation of a display according to another embodiment.
Figure 6B:
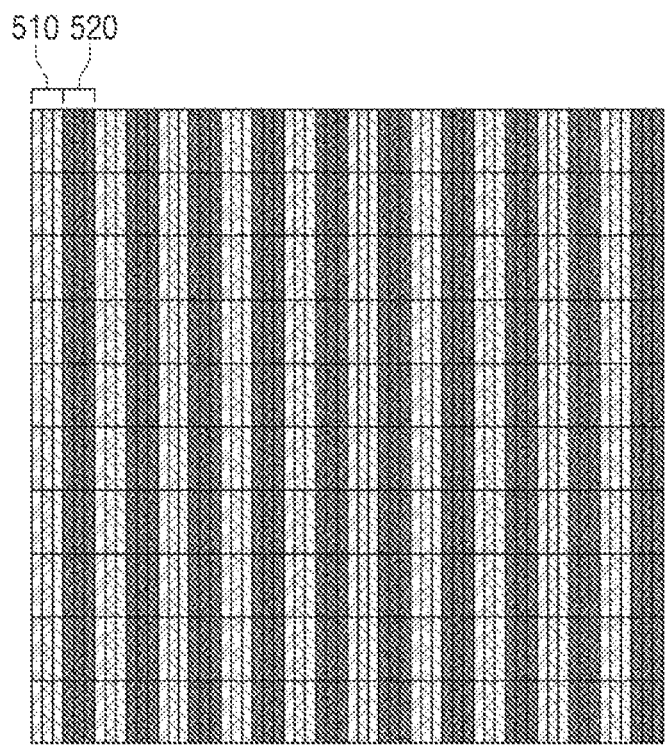
FIG. 6B is a view illustrating a form of another implementation of the display according to another embodiment.
Figure 6C:
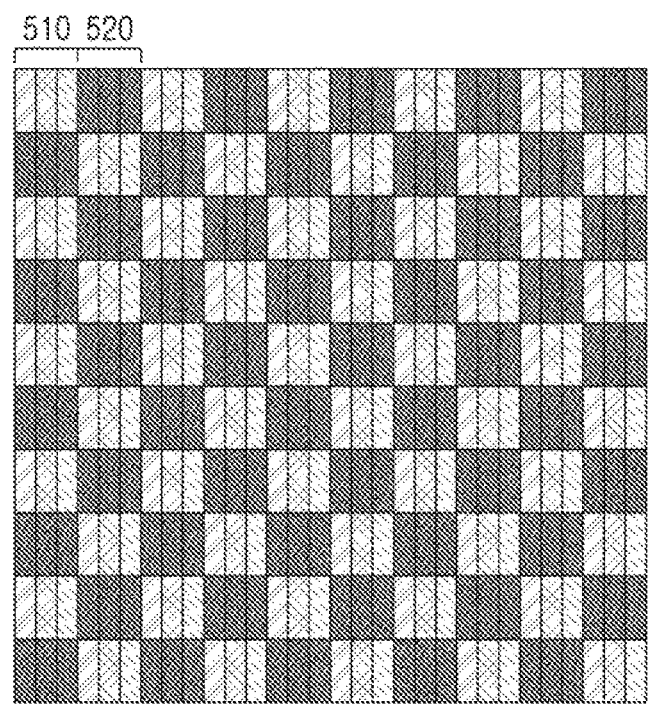
FIG. 6C is a view illustrating a form of another implementation of the display according to another embodiment.

FIGS. 6A to 6C are views illustrating a form of implementation of a display according to another embodiment.

According to an embodiment, the image display pixels 510 and the image sensing elements 520 may be vertically disposed two-dimensionally as illustrated in FIG. 6A. For example, as illustrated, the image sensing element 520 may be disposed on a front surface or a rear surface of the image display pixel 510.

According to another embodiment, the image display pixels 510 and the image sensing elements 520 may be horizontally disposed two-dimensionally as illustrated in FIG. 6B. For example, as illustrated, the image sensing element 520 may be disposed on the right side or the left side of the image display pixel 510.

According to another embodiment, the image display pixels 510 and the image sensing elements 520 may be disposed two-dimensionally to vertically and horizontally cross as illustrated in FIG. 6C. For example, as illustrated, the image display pixels 510 may be alternately disposed so as not to be adjacent to each other, and the image sensing elements 520 may also be alternatively disposed so as not to be adjacent to each other.

The panel device 110 may also include a driving circuit, a backlight unit, and the like which may be implemented in the form of an a-si thin-film-transistor (TFT), a low temperature poly silicon (LTPS) TFT, and an organic TFT (OTFT).

Referring back to FIG. 4, the optical element 120 serves to collect light incident from a specific viewing zone. Here, the optical element 120 may be implemented as a micro-lens array, a lenticular lens, or another type of small lens array. Here, the optical element 120 may be disposed on an upper portion of the panel device. In this case, the plurality of image sensing elements 520 may be configured to sense an incident light through the optical element.

The optical element 120 may collect the light incident from the specific viewing zone and provide the collected light to the image sensing elements IS. In this case, the image sensing elements IS may acquire an image signal based on the light collected through the optical element 120. For example, the image sensing element IS may include an optoelectronic element, and may thus acquire the image signal by converting the incident light into an electrical signal. In this case, the electrical signal may be transmitted to the processor 140 through a metal wire located on an upper portion of a substrate.

The viewing zone adjusting assembly 130 is configured to adjust a field of view (FOV) of the plurality of image sensing elements IS. According to an embodiment, the viewing zone adjusting assembly 130 may adjust the FOV of each of the plurality of image sensing elements IS. According to another embodiment, the viewing zone adjusting assembly 130 may adjust the FOV of each of one or more image sensing elements IS differently, and as a result, may adjust the FOV of the panel device 110.

The viewing zone adjusting assembly 130 according to an embodiment may include a liquid crystal shutter disposed on or below the optical element 120 and constituted by a plurality of cells having a smaller size than that of the image sensing element IS. The liquid crystal shutter refers to a form implemented to block light similar to a shutter of a camera. Here, each of the plurality of cells may operate in a liquid crystal shutter method according to an applied voltage. For example, by controlling whether a voltage is applied to each of the plurality of cells, whether or not each of the plurality of cells is opened or closed is controlled, and a viewing zone of the image sensing element IS may be adjusted based on the opening or closing of each of the plurality of cells.

The viewing zone adjusting assembly 130 according to another embodiment may include a voltage applier that applies a voltage to the optical element. In this case, the optical element may include a plurality of liquid crystal lenses whose liquid crystal alignment angles change according to the intensity of the voltage. In this case, the viewing zone of the image sensing element IS may be adjusted by controlling at least one of whether or not the voltage is applied to the liquid crystal lens corresponding to each of the image sensing elements IS or the intensity of the applied voltage.

A detailed description related to the viewing zone adjusting assembly 130 will be described later with reference to the accompanying drawings.

The processor 140 controls an overall operation of the electronic apparatus 100.

According to an embodiment, the processor 140 may be implemented as a digital signal processor (DSP), a microprocessor, or a timing controller (TCON) that processes digital image signals. However, the processor 140 is not limited thereto, but may include one or more of a central processing unit (CPU), a micro controller unit (MCU), a micro processing unit (MPU), a controller, an application processor (AP), a communication processor (CP), and an ARM processor, or may be defined as the corresponding term. In addition, the processor 140 may also be implemented as a system-on-chip (SoC) or a large scale integration (LSI) in which a processing algorithm is embedded, and may also be implemented in the form of a field programmable gate array (FPGA).

The processor 140 may control the viewing zone adjusting assembly 130 to adjust the FOV of at least one image sensing element IS, and control the panel device 110 to display an image generated based on the sensed incident light.

The processor 140 may control the viewing zone adjusting assembly 130 to adjust the FOV of at least one image sensing element IS, and may process input signals received from the plurality of image sensing elements and display the processed input signals on the image display pixels.

According to an embodiment, when the viewing zone adjusting assembly 130 is implemented by the liquid crystal shutter method, the processor 140 may control the opening or closing operation of each of the plurality of cells by controlling whether or not the voltage is applied to each of the plurality of cells constituting the liquid crystal shutter. Accordingly, the FOV of the image sensing element may be adjusted.

By using such a principle, the FOV of the display may also be adjusted.

In this case, the processor 140 may adjust the FOV of the display by controlling the viewing zone adjusting assembly 130 to adjust at least one of an opening position or an opening size of the corresponding liquid crystal shutter based on an arrangement position of each of the optical lenses included in the optical element 120. Here, the FOV of the display may be a FOV integrally provided by the FOV of each of the plurality of image sensing elements included in the electronic apparatus 100. That is, when the plurality of image sensing elements are assumed as one integrated camera, the FOV of the display may be a FOV of the integrated camera. For example, the processor 140 may differently adjust the FOVs of the plurality of image sensing elements disposed at different arrangement positions according to a user command (or user interaction). As an example, when a user command such as an enlargement command or a reduction command is input, the processor 140 may adjust at least one of an opening position or an opening size of at least one liquid crystal shutter to provide an enlarged or reduced image according to the user command. That is, the processor 140 may adjust the FOV of the display to correspond to the user command.

For example, when the FOV of the display is enlarged according to the user command, the processor 140 may control an opening or closing operation of each of the plurality of cells such that light is incident from each of the liquid crystal shutters corresponding to at least one sensing element disposed in an outer region to at least one cell region located at a first position. Here, the cell region of the first position may be a cell region of a position close to a center region of the panel device 110 in the liquid crystal shutter disposed in the outer region. A detailed description thereof will be made with reference to FIGS. 8A and 8B.

When the FOV of the display is reduced according to the user command, the processor 140 may control an opening or closing operation of each of the plurality of cells such that light is incident from each of the liquid crystal shutters corresponding to at least one sensing element disposed in an outer region to at least one cell region located at a second position. Here, the cell region of the second position may be a cell region of a position far from the center region of the panel device 110 in the liquid crystal shutter disposed in the outer region. A detailed description thereof will be made with reference to FIGS. 8C and 8D.

According to another embodiment, when the viewing zone adjusting assembly 130 is implemented by a liquid crystal lens method, the FOV of the corresponding image sensing element may be adjusted by controlling at least one of whether or not the voltage is applied to each of the plurality of liquid crystal lenses or the intensity of the applied voltage.

In addition, the processor 140 may adjust the FOV of the display by controlling the voltage applier to apply different voltages to each of the plurality of crystal lenses based on the arrangement positions of the plurality of liquid crystal lenses.

For example, when the FOV of the display is enlarged according to the user command, the processor 140 may apply the voltage to the corresponding liquid crystal lens such that the FOV of the liquid crystal lens corresponding to at least one sensing element disposed in the outer region is enlarged, and may also apply an appropriate voltage to the remaining liquid crystal lenses based on the positions of the liquid crystal lenses.

When the FOV of the display is reduced according to the user command, the processor 140 may apply the voltage to the corresponding liquid crystal lens such that the FOV of the liquid crystal lens corresponding to at least one sensing element disposed in the outer region is reduced, and may also apply an appropriate voltage to the remaining liquid crystal lenses based on the positions of the liquid crystal lenses.

Figure 7:
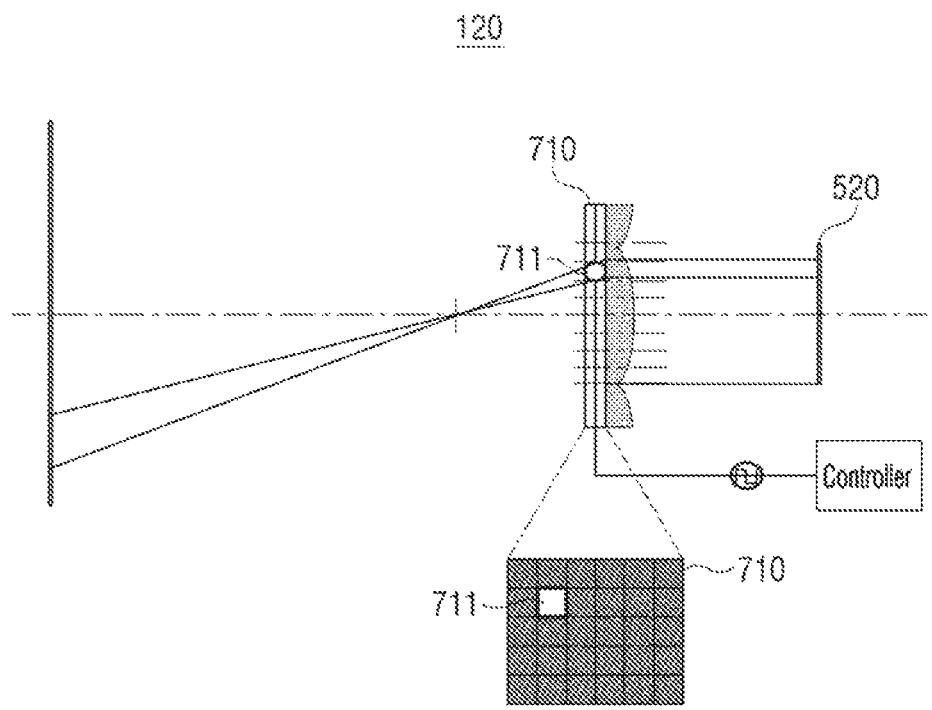
FIG. 7 is a diagram illustrating a method for adjusting a FOV of an image sensing element according to an embodiment.

FIG. 7 is a diagram illustrating a method for adjusting a FOV of an image sensing element according to an embodiment.

The viewing zone adjusting assembly according to an embodiment may be implemented in the form of a liquid crystal shutter as illustrated in FIG. 7. Here, a liquid crystal shutter 710 may have a form including a plurality of cells having a smaller size than that of the image sensing element 520. For example, the liquid crystal shutter 710 may be designed to have a TFT array structure so that light may be incident on a portion of the image sensing element 520. For example, the liquid crystal shutter 710 may be constituted by a transparent substrate and an electrode, and may be implemented such that cells to which no power is applied maintain a transparent state to transmit light, and cells to which power is applied are converted into an opaque state and thus does not transmit light. For example, the liquid crystal shutter 710 may be implemented as a pin hole mask or pin hole mask array.

Referring to FIG. 7, when the power is not applied only to at least one cell region 711 of the liquid crystal shutter 710 and the power is applied to the remaining cell regions, light may be incident only through the cell region 711, and the incident light may be refracted in one region of the optical element 120 and may be incident to a portion of the image sensing element 520. That is, the field of view (FOV) of the image sensing element 520 may be adjusted through the control of the liquid crystal shutter 710. According to an embodiment, at least one optical element 120 may be disposed on or below each liquid crystal shutter 710 to generate a separate FOV for each image sensing element 520.

According to an embodiment, a controller for controlling power application to the liquid crystal shutter 710 may be provided, and the controller may control the liquid crystal shutter 710 according to a control signal of the processor 140.

FIGS. 8A to 8D are diagrams illustrating a method for adjusting a FOV of a display according to an embodiment.

Figure 8A:
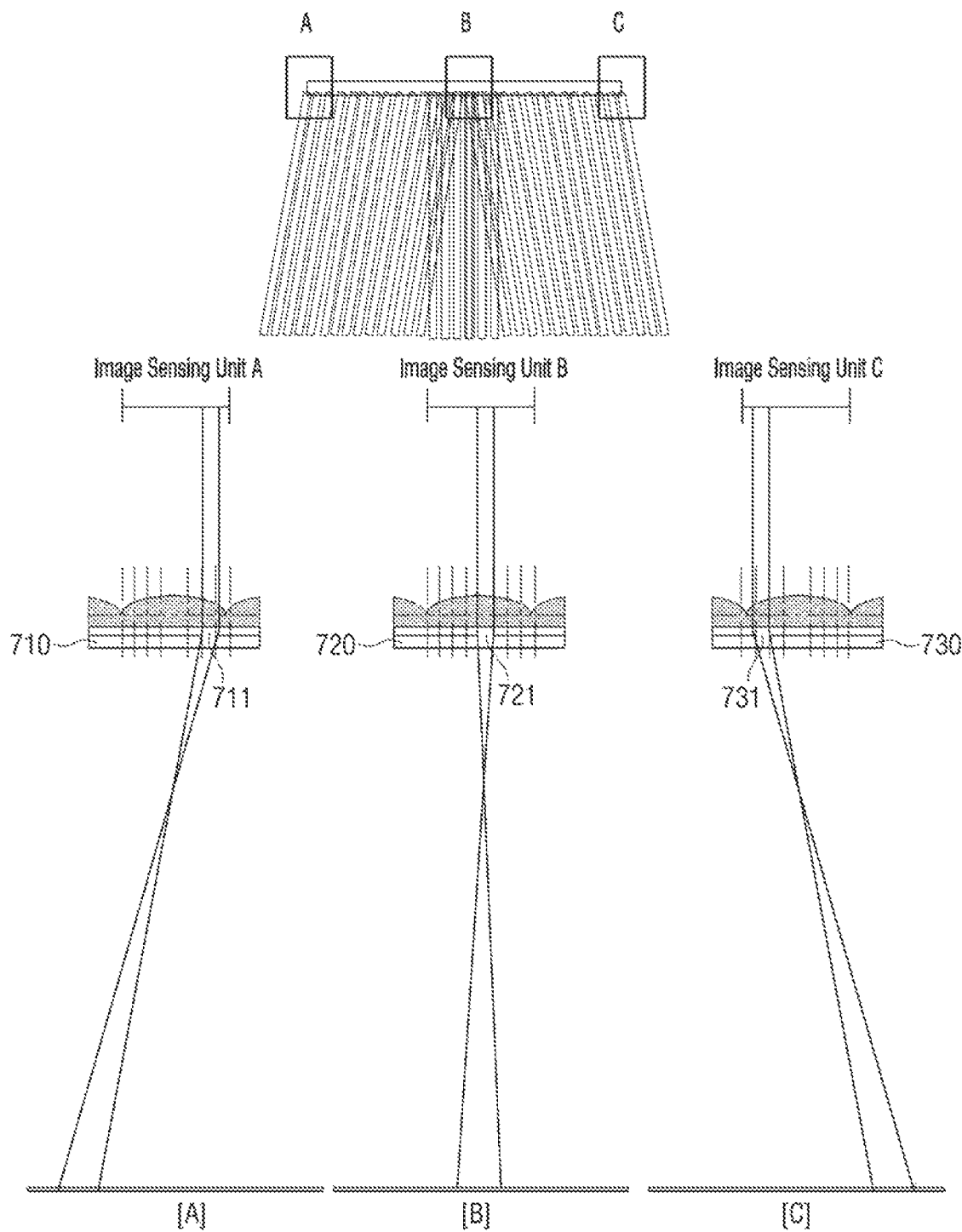
FIG. 8A is a diagram illustrating a method for widening a FOV of a display using a liquid crystal shutter method according to an embodiment.
Figure 8B:
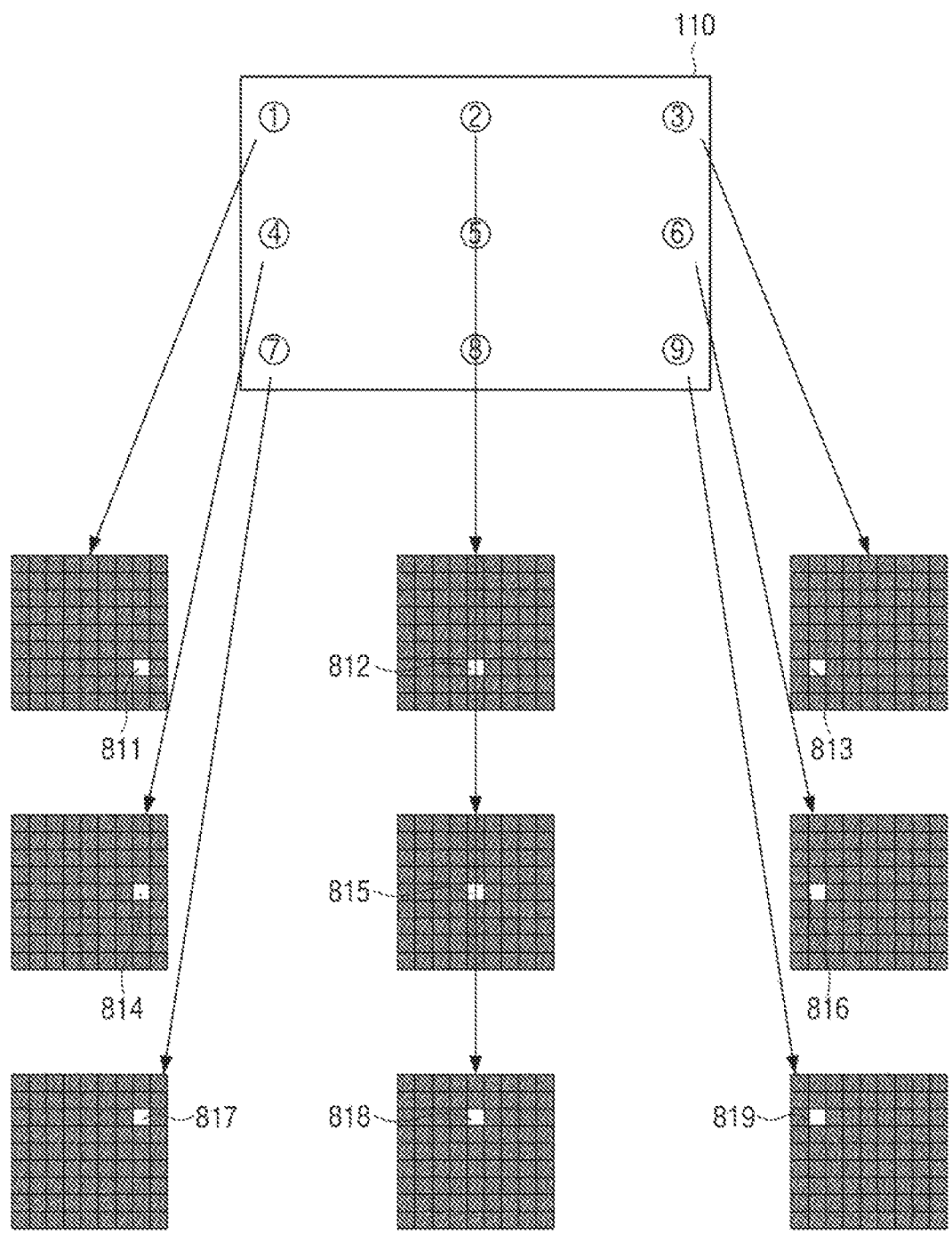
FIG. 8B is a diagram illustrating a method for widening a FOV of a display using a liquid crystal shutter method according to an embodiment.

FIGS. 8A and 8B illustrate a case in which the FOV of the display is widened using the liquid crystal shutter method. As illustrated, an opening position of the liquid crystal shutter corresponding to each position of the image sensing element may be controlled. For example, as illustrated in FIG. 8A, a liquid crystal shutter 720 corresponding to an image sensing element B positioned at the center region may be controlled such that a cell region 721 positioned at a center portion is opened, and liquid crystal shutters 710 and 730 corresponding to image sensing elements A and C positioned in outer region may be controlled such that cell regions 711 and 731 of positions closer to the center region of the panel device 110 are opened.

Specifically, as illustrated in FIG. 8B, assuming image sensing elements disposed at positions ① to ⑨ of the panel device 110, a liquid crystal shutter corresponding to an image sensing element ⑤ positioned at the center region may be controlled such that a cell region 815 positioned at a center portion is opened, and liquid crystal shutters corresponding to image sensing elements ①, ②, ③, ④, ⑥, ⑦, ⑧, and ⑨ positioned in outer region may be controlled such that cell regions 811, 812, 813, 814, 816, 817, 818, and 819 of positions closer to the center region of the panel device 110 are opened. In this case, the FOV of the display is widened as illustrated.

Figure 8C:
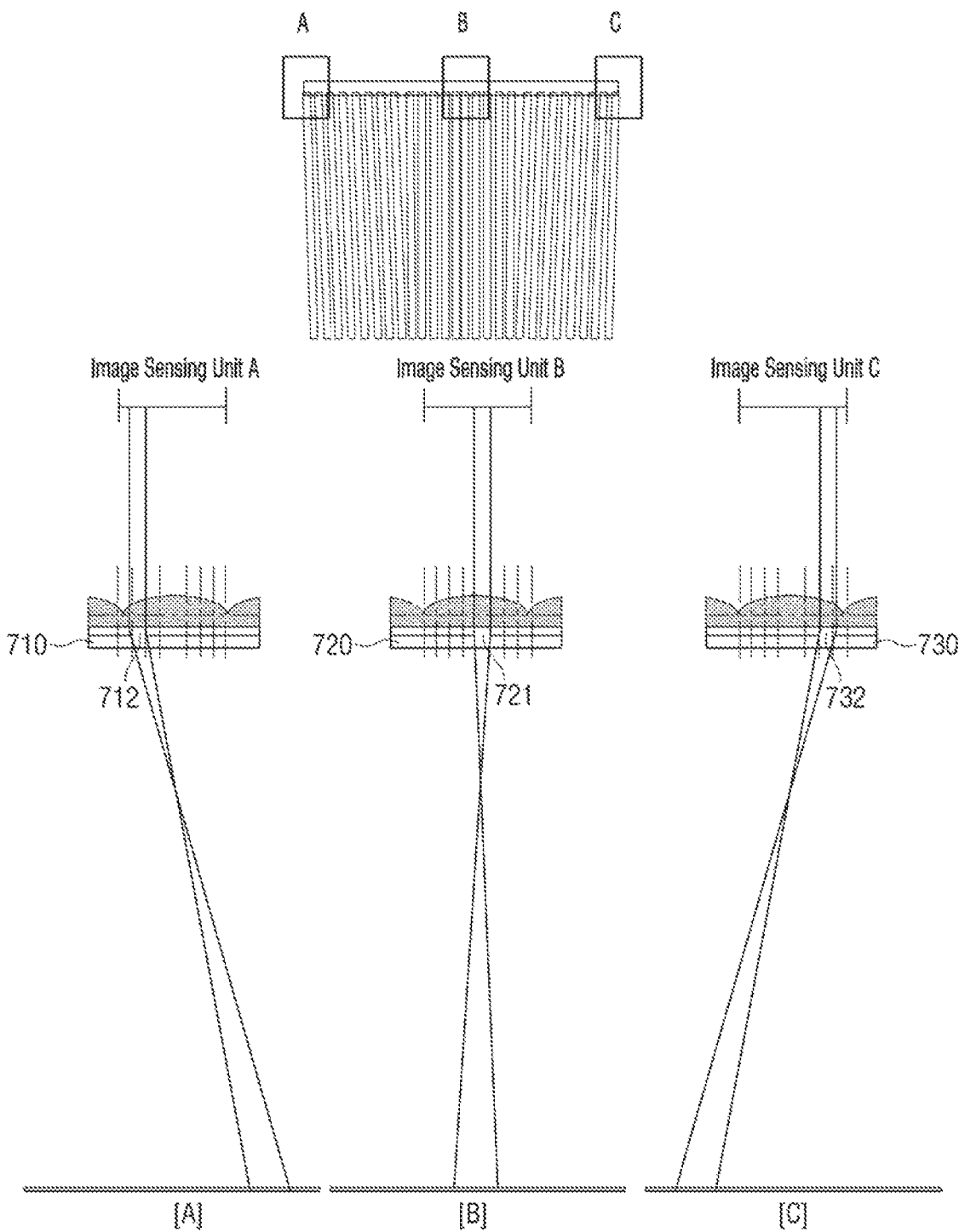
FIG. 8C is a diagram illustrating a method for narrowing a FOV of a display using a liquid crystal shutter method according to an embodiment.
Figure 8D:
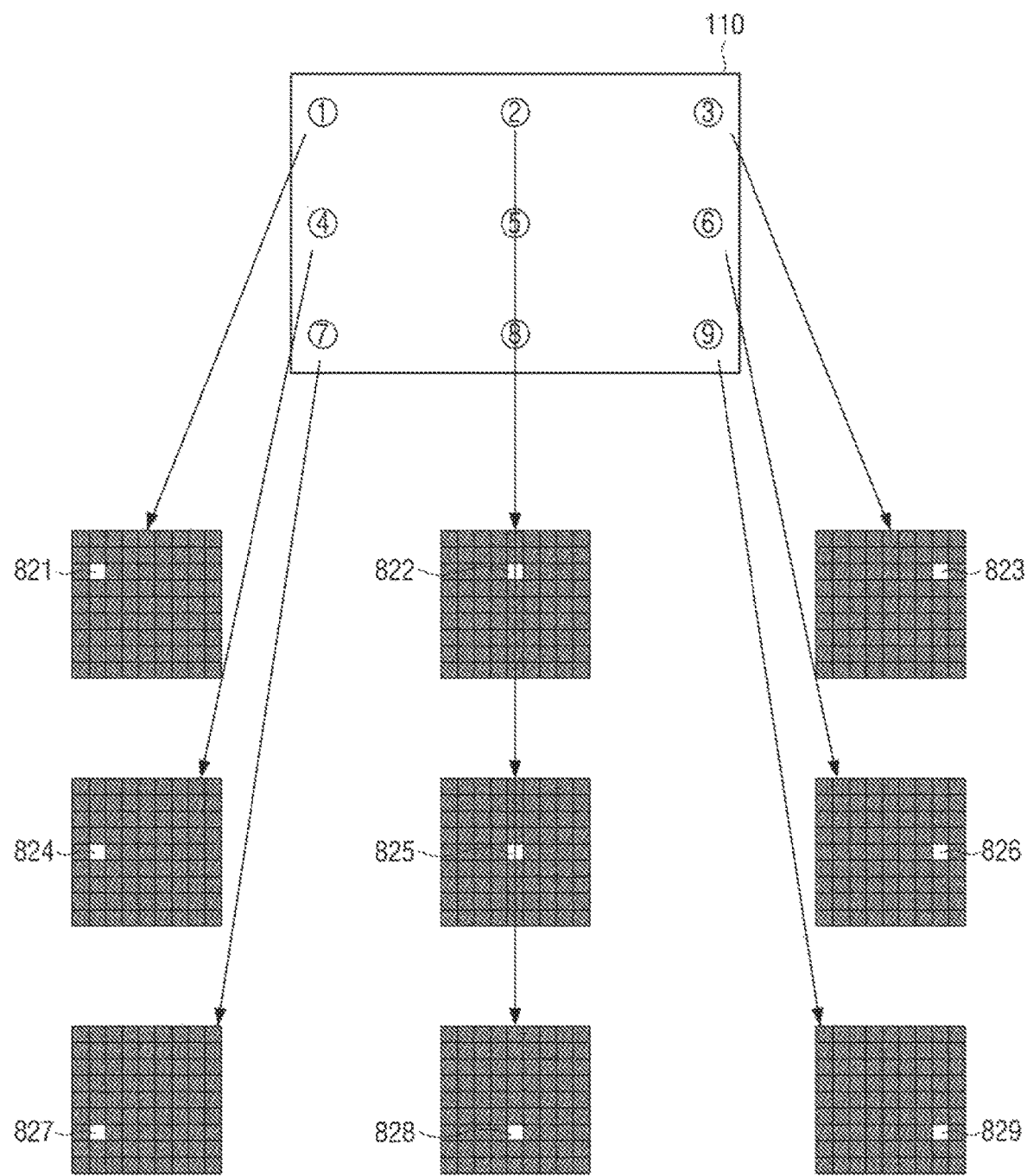
FIG. 8D is a diagram illustrating a method for narrowing a FOV of a display using a liquid crystal shutter method according to an embodiment.

FIGS. 8C and 8D illustrate a case in which the FOV of the display is narrowed using the liquid crystal shutter method. As illustrated, an opening position of the liquid crystal shutter corresponding to each position of the image sensing element may be controlled. For example, as illustrated in FIG. 8C, a liquid crystal shutter 720 corresponding to an image sensing element B positioned at the center region may be controlled such that a cell region 721 positioned at a center portion is opened, and liquid crystal shutters 710 and 730 corresponding to image sensing elements A and C positioned in outer region may be controlled such that cell regions 712 and 732 of positions far from the center region of the panel device 110 are opened.

For example, as illustrated in FIG. 8D, assuming image sensing elements disposed at positions ① to ⑨ of the panel device 110, a liquid crystal shutter corresponding to an image sensing element ⑤ positioned at the center region may be controlled such that a cell region 825 positioned at a center portion is opened, and liquid crystal shutters corresponding to image sensing elements ①, ②, ③, ④, ⑥, ⑦, ⑧, and ⑨ positioned in outer region may be controlled such that cell regions 821, 822, 823, 824, 826, 827, 828, and 829 of positions farther away from the center region of the panel device 110 are opened. In this case, the FOV of the display is narrowed as illustrated.

FIGS. 9A to 9D are diagrams illustrating a method for adjusting a FOV of an image sensing element according to another embodiment.

According to another embodiment, the optical element 120 may be implemented as a liquid crystal lens array (e.g., a micro liquid crystal lens array) to perform a function of the viewing zone adjusting assembly 130. For example, the ferroelectric of the liquid crystal may be used to change a focal length of the liquid crystal lens. That is, a change may occur in an orientation (or orientation angle) of liquid crystal molecules according to the intensity of the voltage, and thus the focal length of the liquid crystal lens may be adjusted. In this case, the image sensing element is preferably formed in a macro pixel structure of 2×2 or more.

According to an embodiment, the liquid crystal lens may include a lens layer 121, a liquid crystal layer 122, and electrode layers 123-1 and 123-2, as illustrated in FIGS. 9A to 9D. The liquid crystal layer 122 may have optical characteristics that change according to the intensity of the voltage applied through the electrode layers 123-1 and 123-2 to control the refraction of light passing through the lens layer 121 in different directions. Here, the electrode layers 123-1 and 123-2 may be formed of a transparent material and have a flat shape to minimize or reduce an influence on the light passing therethrough. For example, as illustrated in FIGS. 9A to 9D, the orientation angle of the liquid crystal molecules may be changed according to the intensity of the voltage applied to the electrode layers 123-1 and 123-2, and thus the focal length of the liquid crystal lens may be changed. As such, when the focal length of the liquid crystal lens is changed, the FOV of the image sensing element 520 may be changed as a result.

Figure 9A:
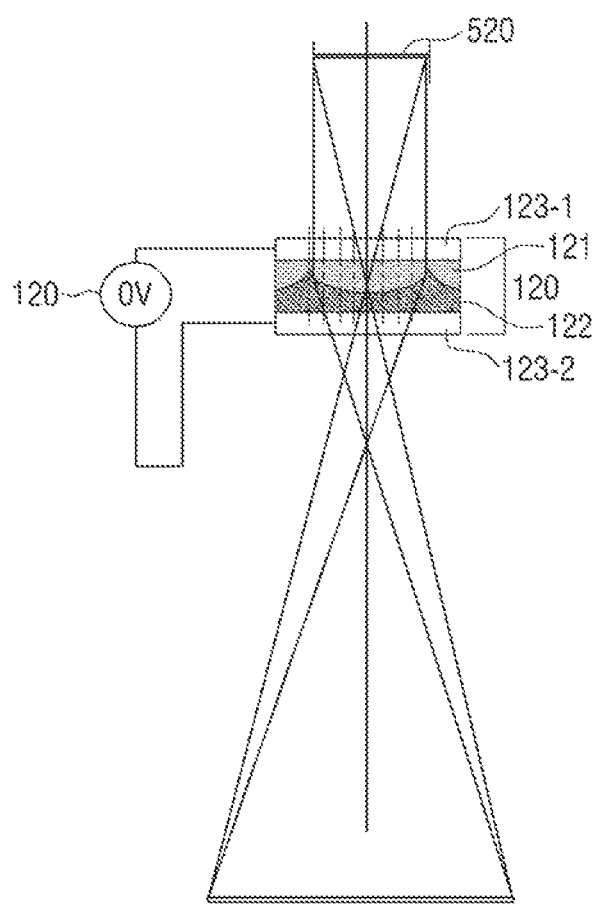
FIG. 9A is a diagram illustrating a method for adjusting a FOV of an image sensing element using a liquid crystal lens method according to another embodiment.
Figure 9B:
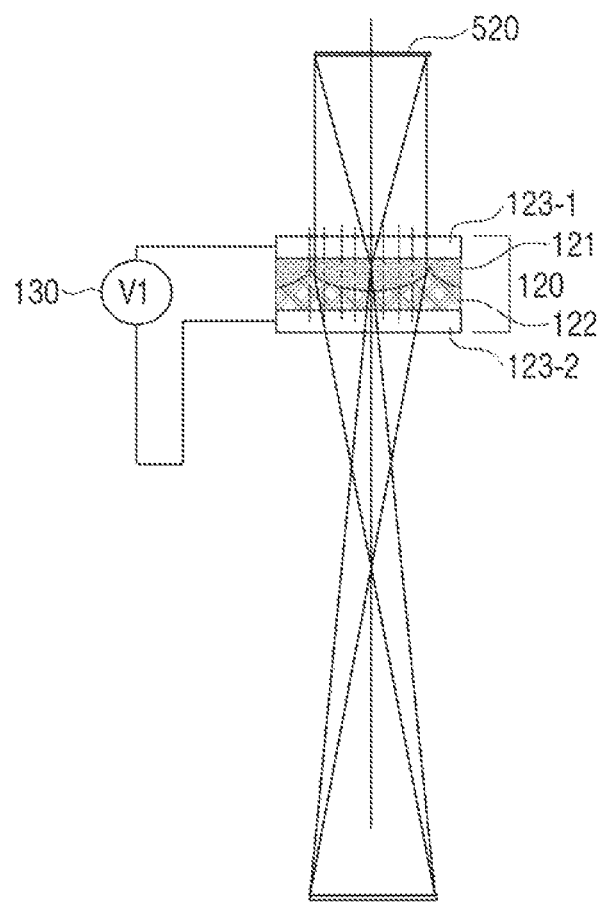
FIG. 9B is a diagram illustrating a method for adjusting a FOV of an image sensing element using a liquid crystal lens method according to another embodiment.
Figure 9C:
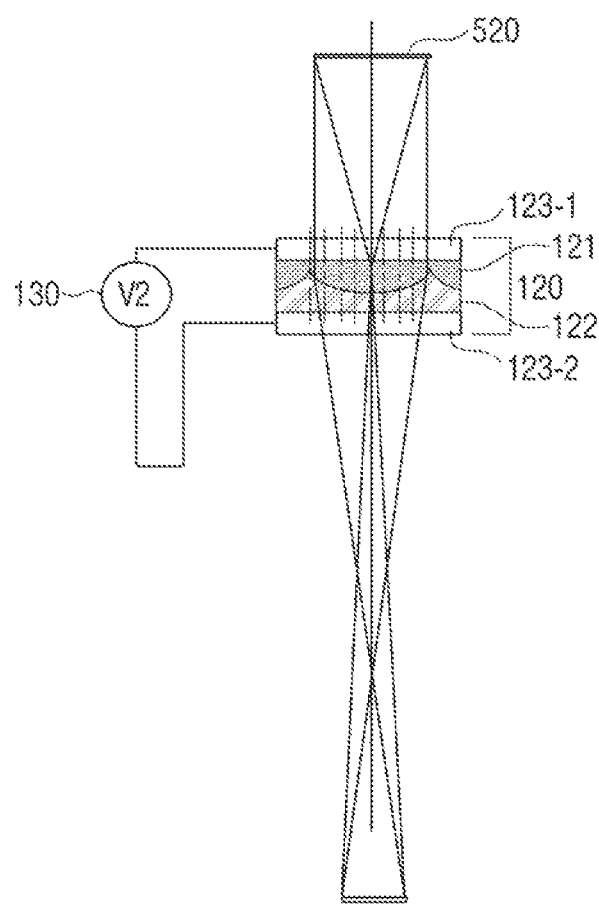
FIG. 9C is a diagram illustrating a method for adjusting a FOV of an image sensing element using a liquid crystal lens method according to another embodiment.
Figure 9D:
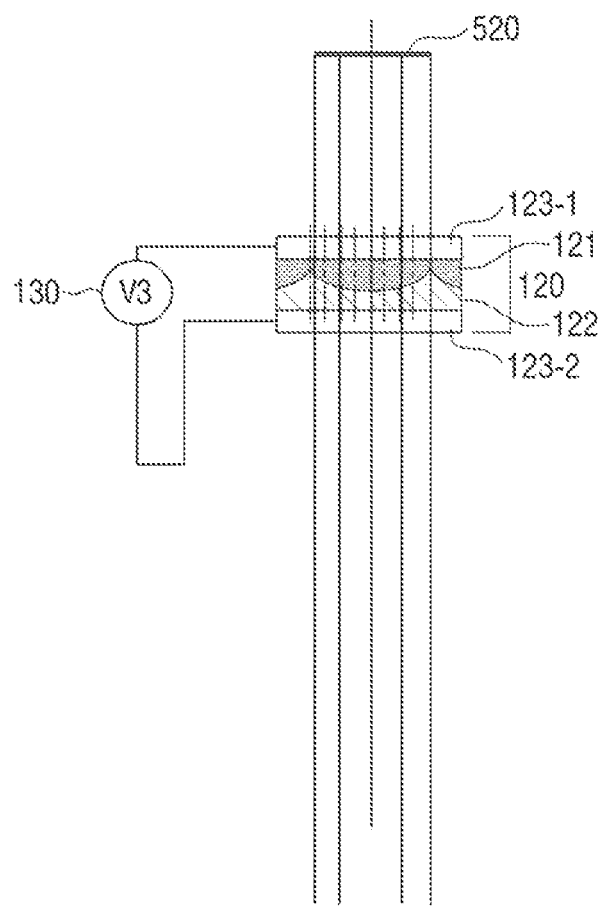
FIG. 9D is a diagram illustrating a method for adjusting a FOV of an image sensing element using a liquid crystal lens method according to another embodiment.
Figure 9E:
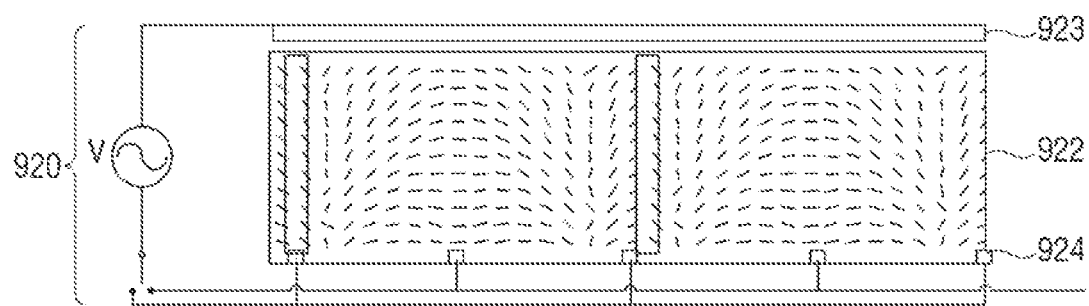
FIG. 9E is a diagram illustrating implementation of a liquid crystal lens according to another embodiment.
Figure 9F:
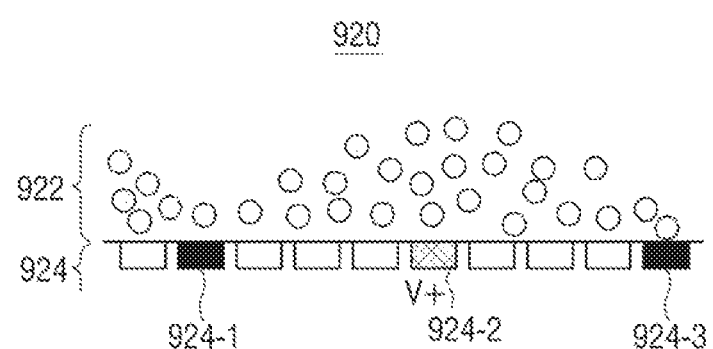
FIG. 9F is a diagram illustrating implementation of a liquid crystal lens according to another embodiment.
Figure 9G:
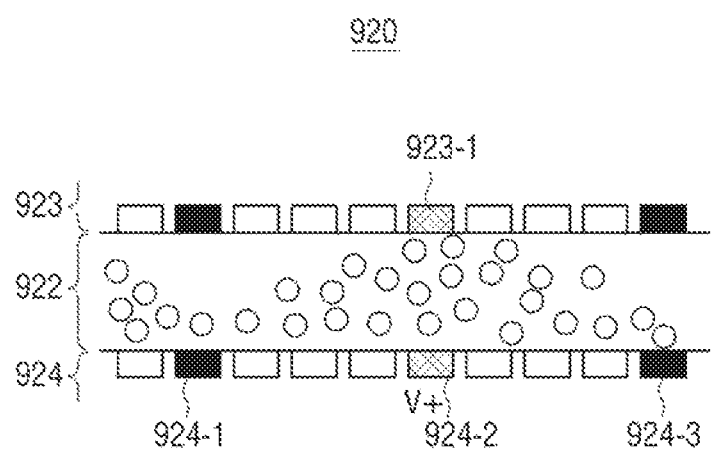
FIG. 9G is a diagram illustrating implementation of a liquid crystal lens according to another embodiment.

FIGS. 9E to 9G are diagrams illustrating implementations of a liquid crystal lens according to another embodiment.

According to another embodiment, a liquid crystal lens 920 may include electrode layers 923 and 924 and a liquid crystal layer 922, as illustrated in FIG. 9A.

The electrode layers 923 and 924 apply an electric field to the liquid crystal layer 922. Here, the electrode layers 923 and 924 may be formed of a transparent material and have a flat shape to minimize or reduce an influence on the light passing through the electrode layers 923 and 924. Here, the liquid crystal layer 922 may form a lens shape according to whether or not a voltage is applied to a plurality of electrodes included in the first electrode layer 924, and the second electrode layer 923 may be a common electrode.

The liquid crystal layer 922 may form lens shapes having different sizes or different shapes according to positions of electrodes to which the voltage is applied among the plurality of electrodes constituting the first electrode layer 924. To this end, the liquid crystal layer 922 may be formed of a liquid or nano material whose lens shape is changed according to a voltage.

FIG. 9F illustrates one example, and the liquid crystal layer 922 may form a lens shape according to a position of an electrode to which the voltage is applied among a plurality of electrodes 924-1, 924-2, and 924-3 constituting the electrode layer 924. To this end, the liquid crystal layer 922 may be formed of a liquid or nano material whose lens shape is changed according to a voltage. For example, when a negative (−) voltage is applied to the electrodes 924-1 and 924-3 spaced apart from each other, and a positive (+) voltage is applied to the electrode located between the electrodes 924-1 and 924-3, the liquid crystal layer 922 forms a liquid-crystal (LC) lens at a corresponding position as illustrated. FIG. 9G illustrates another example, and the LC lens may be formed at the corresponding position by a method of applying the voltage to the common electrode 923-1 as well as the plurality of electrodes 924-1, 924-2, and 924-3.

The processor 140 may adjust the FOV of the corresponding image sensing element by applying different voltages so that the lens shape formed in the liquid crystal layer 922 is changed.

Figure 10:
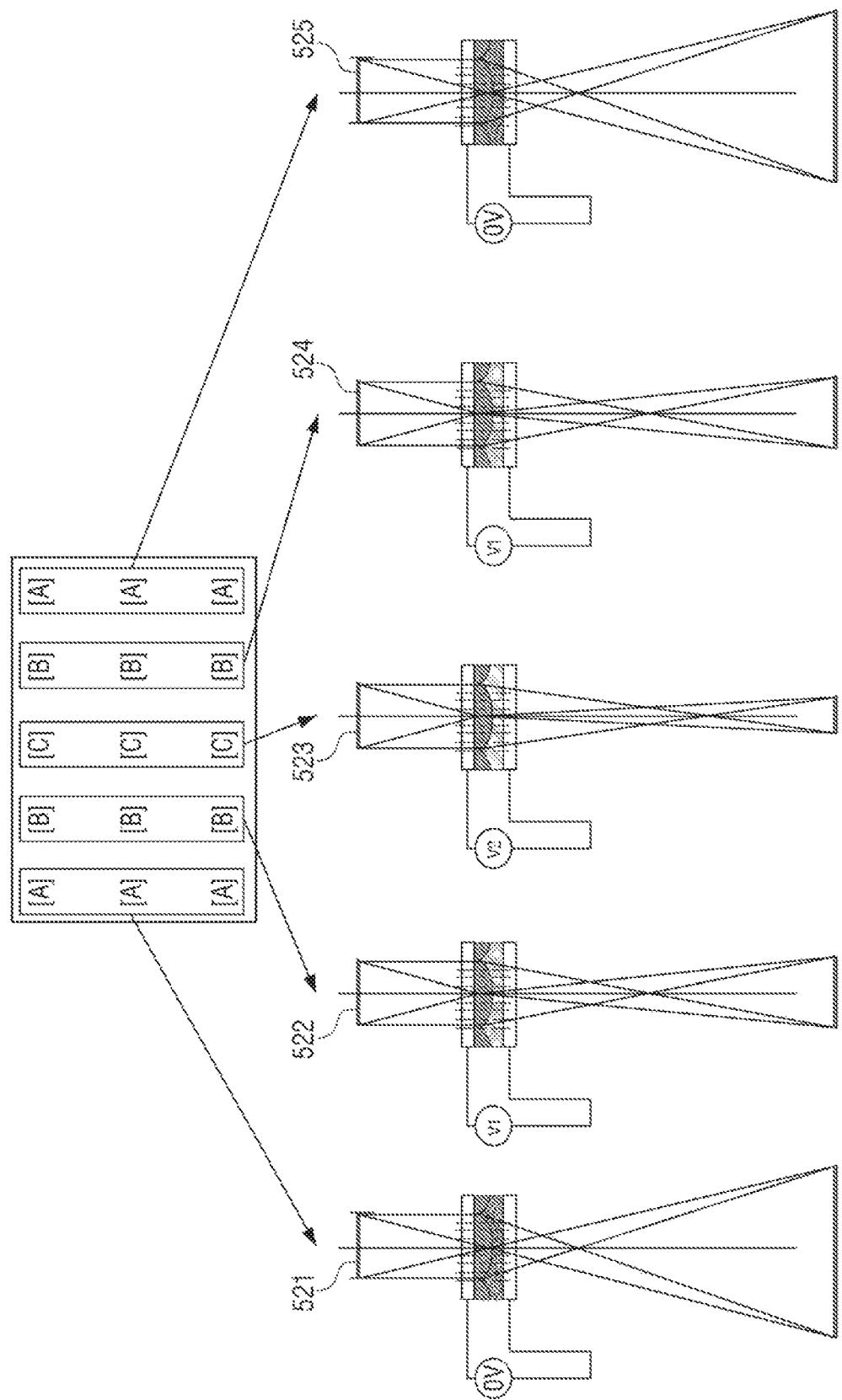
FIG. 10 is a diagram illustrating a method for adjusting a FOV of a display using a liquid crystal lens method according to another embodiment.

FIG. 10 is a diagram illustrating a method for adjusting a FOV of a display according to an embodiment.

FIG. 10 illustrates a case in which the FOV of the display is adjusted using the liquid crystal lens method. As illustrated, a focal length of the liquid crystal lens corresponding to each position of the image sensing element, that is, the FOV, may be adjusted. For example, as illustrated, a liquid crystal lens corresponding to the image sensing element 523 positioned at the center region may adjust the FOV of the liquid crystal lens so that the FOV is narrowed, and the focal length of the liquid crystal lens may be adjusted so that the FOV of the corresponding liquid crystal lenses 522, 524, 521, and 525 is widened as the position of the image sensing element moves away from the center region. In this case, the FOV of the display may also be adjusted based on the FOV of each liquid crystal lens.

Referring back to FIG. 4, the processor 140 may control driving timings of the plurality of image sensing elements and the plurality of image display pixels differently. For example, the processor 140 may perform time division driving so that the plurality of image sensing elements are not driven during a first period in which the plurality of image display pixels are driven, and the plurality of image display pixels are not driven during a second period in which the plurality of image sensing elements are driven. This is to exclude interference of light emitted from the image display pixels and light collected by the image sensing elements. In some cases, the first period in which the image display pixels are driven and the second period in which the image sensing elements are driven may partially overlap. For example, at least one image display pixel and at least one image sensing element may be simultaneously driven during at least some of the periods changed to the first period and the second period.

Figure 11:
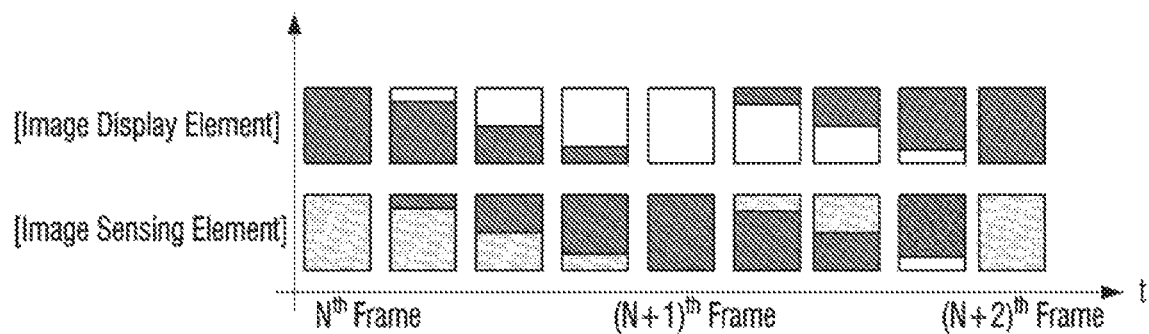
FIG. 11 is a diagram illustrating a display driving method according to an embodiment.
Figure 12:
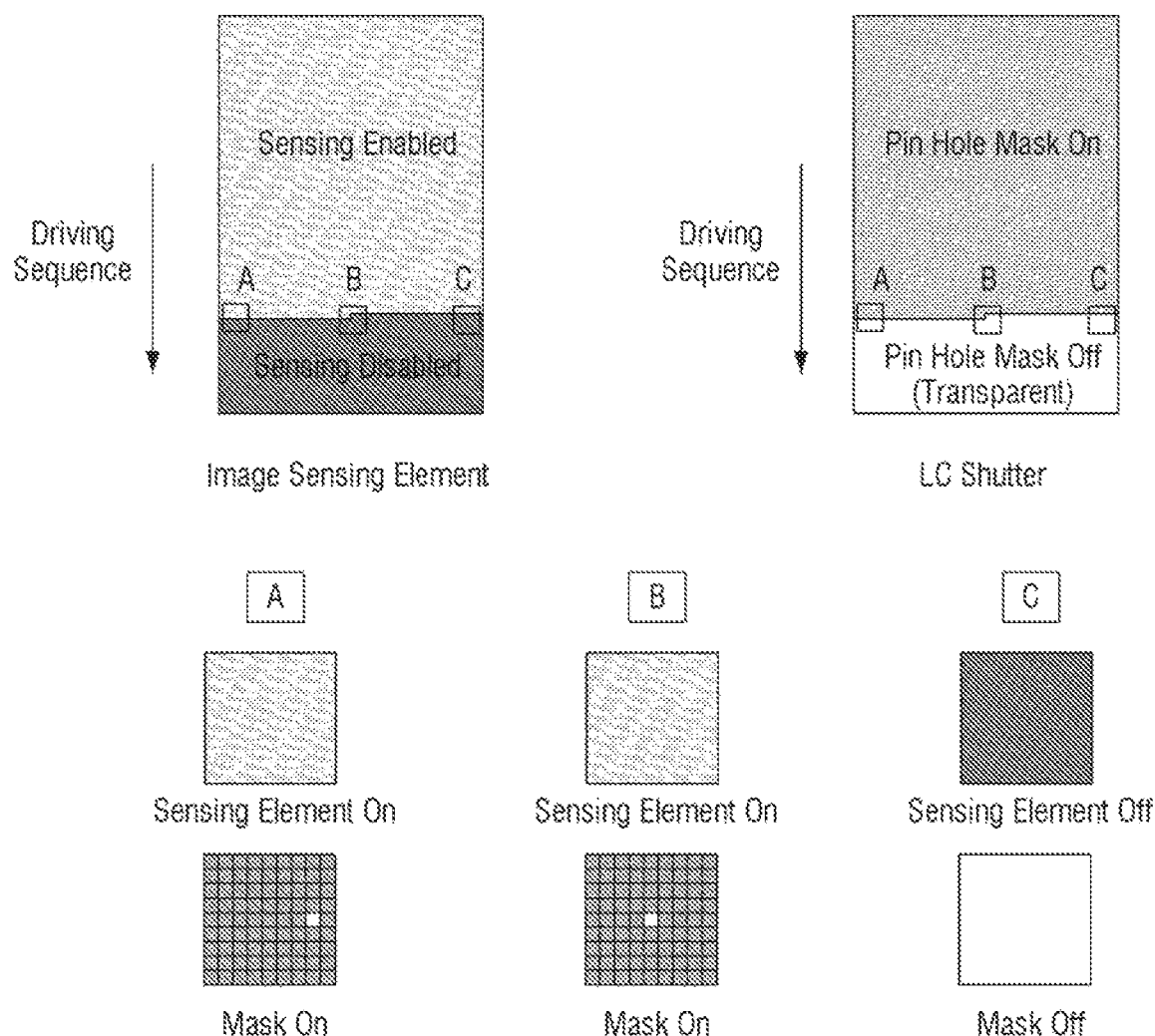
FIG. 12 is a diagram illustrating a display driving method using a liquid crystal shutter method according to an embodiment.
Figure 13:
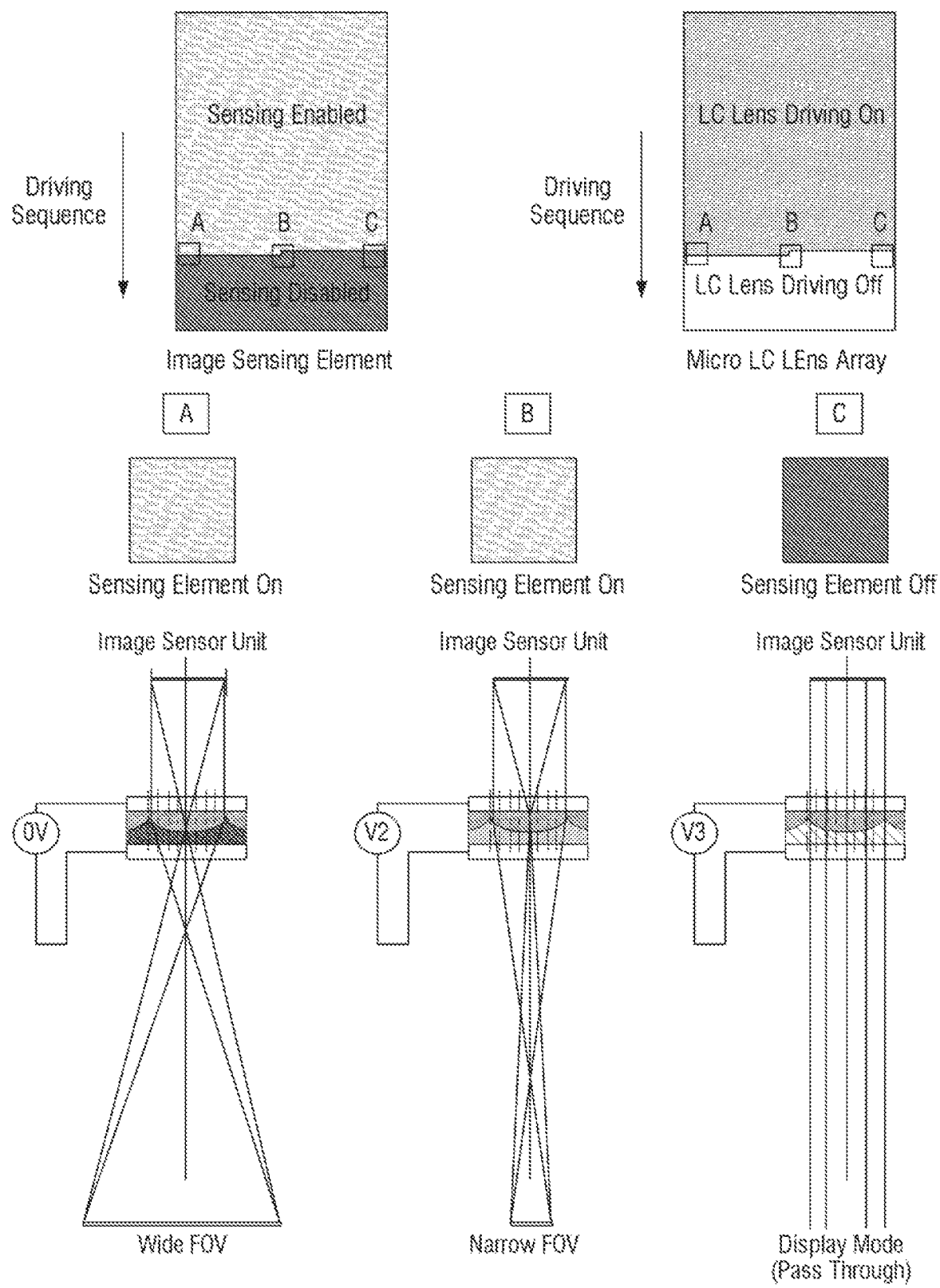
FIG. 13 is a diagram illustrating a display driving method using a liquid crystal lens method according to another embodiment.

FIGS. 11 to 13 are diagrams illustrating a display driving method according to an embodiment.

According to an embodiment, as illustrated in FIG. 11, the image sensing element may be deactivated while the image display pixel is driven. For example, the liquid crystal shutter or the liquid crystal lens may be switched to a transparent state so that light emitted from the image display pixel is not shielded. The image display pixel may be deactivated while the image sensing element is driven. For example, in the case of the liquid crystal shutter method, the FOV may be adjusted by controlling at least one of the opening position or size of the liquid crystal shutter mask, for example, the pin hole mask according to the position of the image sensing element on the panel. In the case of the liquid crystal lens method, the FOV may be adjusted by differently applying the voltage of the liquid crystal lens according to the position of the image sensing element on the panel.

For example, as illustrated in FIGS. 12 and 13, in a photographing mode, the image sensing elements disposed on the panel device 110 may be sequentially activated in a line unit in a horizontal direction, and may be sequentially activated in the next line in the vertical direction.

FIG. 12 illustrates a case in which the viewing zone adjusting assembly 130 is implemented by the liquid crystal shutter method. As illustrated, when a specific image sensing element is activated, the liquid crystal shutter mask corresponding to the image sensing element may also be synchronized with the image sensing element and driven.

For example, in a state in which the image sensing elements A and B are activated and the image sensing element C is deactivated, as illustrated at a specific time when the image sensing elements included in a specific line are sequentially activated in a horizontal direction, the liquid crystal shutter masks corresponding to the image sensing elements A, B, and C may be driven in synchronization. In this case, at least one of the opening position or size of the liquid crystal shutter mask may be differently controlled based on the position of each sensing element. For example, based on the position of the image sensing element A, only at least one cell in the center region of the left edge of the liquid crystal shutter mask may be maintained in a transparent state to transmit light, and cells in the remaining region may be changed to an opaque state to block light. In addition, based on the position of the image sensing element B, only at least one cell in the center region of the liquid crystal shutter mask may be maintained in a transparent state to transmit light, and cells in the remaining region may be changed to an opaque state to block light. In addition, because the image sensing device C is in an inactive state, the viewing zone adjusting assembly 130 may be controlled to maintain the transparent state of all of the cells included in the liquid crystal shutter mask corresponding to the image sensing device C to transmit light.

FIG. 13 illustrates a case in which the viewing zone adjusting assembly 130 is implemented by the liquid crystal lens method. As illustrated, when a specific image sensing element is activated, the liquid crystal lens corresponding to the image sensing element may also be synchronized with the image sensing element and driven.

For example, in a state in which the image sensing elements A and B are activated and the image sensing element C is deactivated, as illustrated at a specific time when the image sensing elements included in a specific line are sequentially activated in a horizontal direction, the liquid crystal lenses corresponding to the image sensing elements A, B, and C may be driven in synchronization. In this case, the focal lengths of the liquid crystal lenses, that is, the FOVs may be differently controlled based on the position of each sensing element. For example, the FOV of the liquid crystal lens may be adjusted to a first value based on the position of the image sensing element A. In addition, the FOV of the liquid crystal lens may be adjusted to a second value based on the position of the image sensing element B. In addition, because the image sensing device C is in an inactive state, the liquid crystal lens corresponding to the image sensing element C may be controlled to transmit light as it is without refractive index.

Referring back to FIG. 4, the processor 140 may process a plurality of images based on the FOV of each of the plurality of images acquired from the plurality of image sensing elements to acquire an output image to be displayed on the image display pixel. For example, when the image sensing elements are implemented as two-dimensional sensing elements in the form of a macro pixel, FOVs of the image signals acquired from the plurality of image sensing elements may overlap. In this case, the processor 140 may acquire an output image signal to be provided to the image display pixel by performing image processing, for example, image stitching processing, on the plurality of image signals acquired from the plurality of image sensing elements. For example, the processor 140 may acquire an image signal reconstructed by the image stitching processing, convert the reconstructed image signal into an electrical signal according to a display driving timing, and transmit the electrical signal to each image display pixel.

Figure 14:
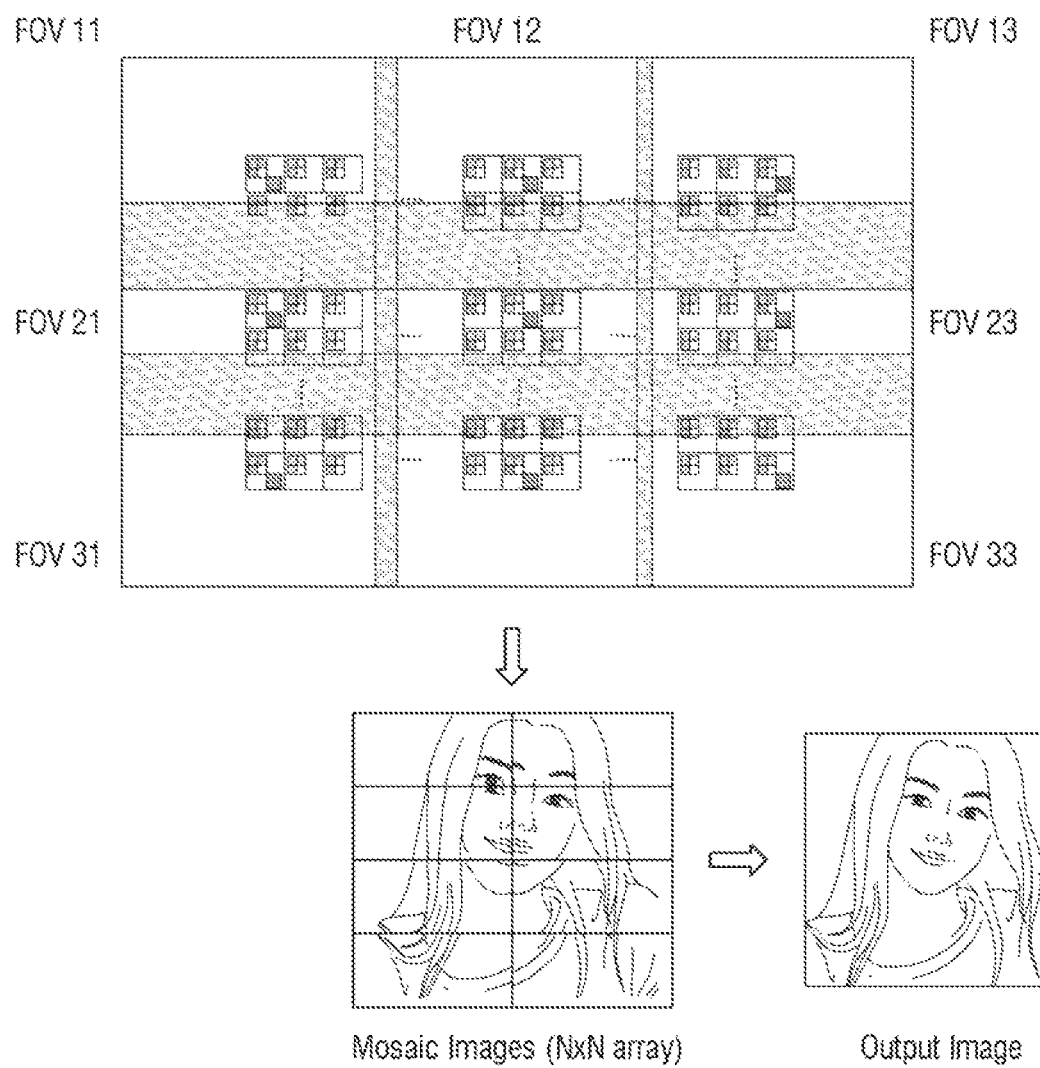
FIG. 14 is a diagram illustrating an image acquiring method according to an embodiment.

FIG. 14 is a diagram illustrating an image acquiring method according to an embodiment.

As illustrated in FIG. 14, as the FOVs of the image signals acquired from each of the image sensing elements in the form of a macro pixel overlap, a mosaic image as illustrated may be acquired. In this case, the processor 140 may perform the image stitching processing to acquire an output image to be displayed on the image display pixel. For example, the processor 140 may acquire the output image through at least one of warping, feature based alignment, rotation, translation, or white balancing. The processor 140 may control the panel device 110 to display the acquired output image. The processor 140 may control the viewing zone adjusting assembly 130 to adjust the FOV corresponding to at least one image sensing element according to various interactions of the user, for example, an image enlargement command or an image reduction command, acquire an output image corresponding to the interaction of the user based on the image signals acquired through the plurality of image sensing elements including an image sensing element with an adjusted FOV, and control the panel device 110 to display the acquired output image. For example, the processor 140 may control the viewing zone adjusting assembly 130 to reduce the FOV of the display according to the image enlargement command of the user, or control the viewing zone adjusting assembly 130 to enlarge the FOV of the display according to the image reduction command of the user.

Figure 15:
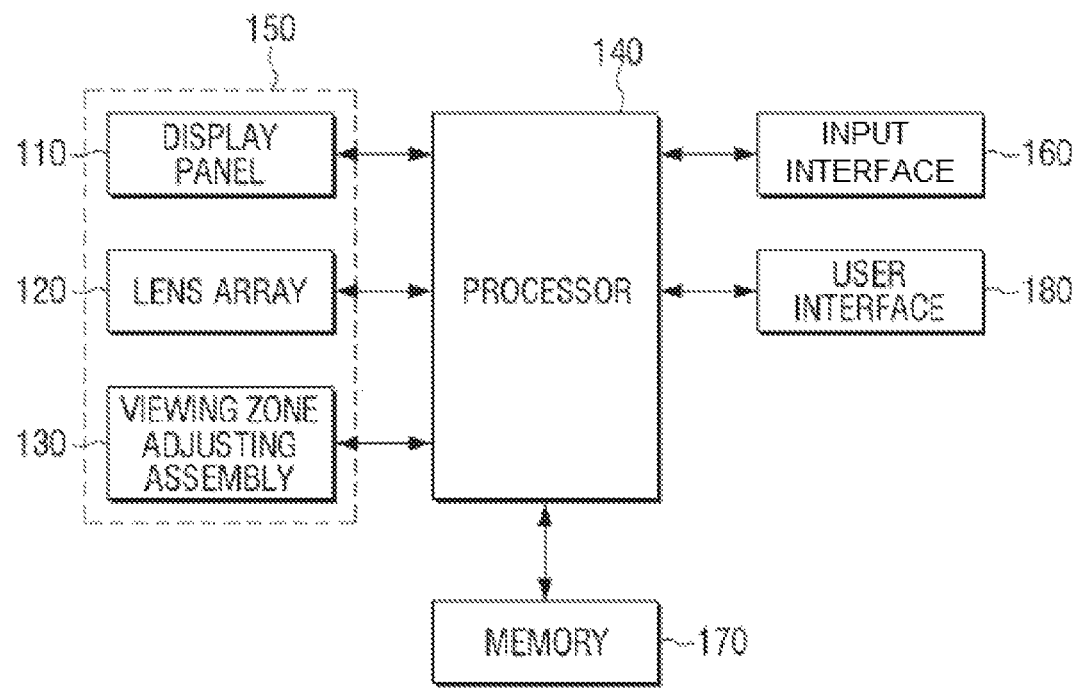
FIG. 15 is a block diagram illustrating a detailed configuration of an electronic apparatus according to an embodiment.

FIG. 15 is a block diagram illustrating a detailed configuration of an electronic apparatus according to an embodiment.

Referring to FIG. 15, the electronic apparatus 100 includes the panel device 110, the optical element 120, the viewing zone adjusting assembly 130, the processor 140, an input interface 160, a memory 170, and a user interface 180.

The configuration of the display 150 including the panel device 110, the optical element 120, and the viewing zone adjusting assembly 130 has been described with reference to FIG. 4, and a detailed description thereof will thus be omitted.

The processor 140 may control the display 150 to display the image processed according to various embodiments.

According to one example, the processor 140 may perform a graphics processing function (video processing function). For example, the processor 140 may generate a screen including various objects such as icons, images, texts, and the like by using a calculator and a renderer. Here, the calculator may calculate attribute values such as coordinate values, shapes, sizes, colors, and the like in which objects are displayed according to a layout of the screen based on a received control command. In addition, the renderer may generate screens of various layouts including the objects based on the attribute values calculated by the calculator. In addition, the processor 140 may perform various image processing such as decoding, scaling, noise filtering, frame rate conversion, resolution conversion, and the like on video data.

According to another example, the processor 140 may perform processing on audio data. For example, the processor 140 may perform various processing such as decoding, amplification, noise filtering, or the like on the audio data.

The input interface 160 receives various types of contents. For example, the input interface 160 may receive an image signal in a streaming or download manner from an external device (e.g., a source device), an external storage medium (e.g., USB), an external server (e.g., web hard drive), or the like through a communication method such as AP-based Wi-Fi (Wireless LAN Network), Bluetooth, Zigbee, wired/wireless local area network (LAN), wide area network (WAN), Ethernet, IEEE 1394, high definition multimedia interface (HDMI), mobile high-definition link (MHL), universal serial bus (USB), display port (DP), thunderbolt, video graphics array (VGA) port, RGB port, D-subminiature (D-SUB), digital visual interface (DVI), or the like. Here, the image signal may be a digital signal, but is not limited thereto.

The memory 170 may store data necessary for various embodiments. For example, the memory 170 may be implemented in the form of a memory embedded in the electronic apparatus 100 or may be implemented in the form of a memory attachable to and detachable from the electronic apparatus 100 according to a data storage purpose. For example, data for driving the electronic apparatus 100 may be stored in the memory embedded in the electronic apparatus 100, and data for an extended function of the electronic apparatus 100 may be stored in the memory attachable to and detachable from the electronic apparatus 100. The memory embedded in the electronic apparatus 100 may be implemented as at least one of a volatile memory (e.g., a dynamic random access memory (DRAM), a static RAM (SRAM), a synchronous dynamic RAM (SDRAM), or the like), or a non-volatile memory (e.g., a one time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash, a NOR flash, or the like), a hard drive, or a solid state drive (SSD)), and the memory attachable to and detachable from the electronic apparatus 100 may be implemented in the form such as a memory card (e.g., a compact flash (CF), a secure digital (SD), a micro secure digital (Micro-SD), a mini secure digital (Mini-SD), an extreme digital (xD), a multi-media card (MMC), or the like), an external memory (e.g., a USB memory) connectable to a USB port, or the like.

The user interface 180 may be implemented as a device such as a button, a touch pad, a mouse, or a keyboard, or may be implemented as a touch screen that may also perform the display function described above and a manipulation/input function. Here, the button may be various types of buttons, such as mechanical buttons, touch pads, wheels, and the like, which are formed in arbitrary areas such as a front portion, a side portion, and a back portion of a main body exterior of the electronic apparatus 100.

The electronic apparatus 100 may further include a tuner and a demodulator according to an implementation.

A tuner may receive a radio frequency (RF) broadcast signal by tuning a channel selected by a user or all previously stored channels among RF broadcast signals received through an antenna.

The demodulator may receive and demodulate a digital IF signal (DIF) converted by the tuner and perform channel decoding.

Figure 16:
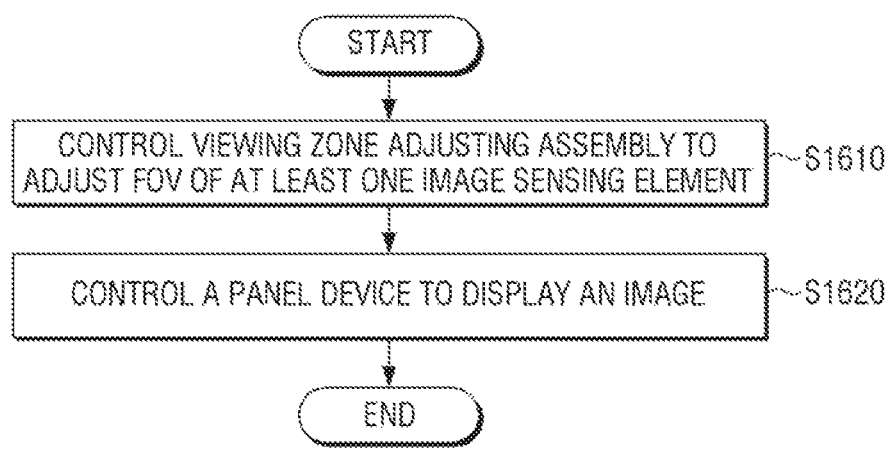
FIG. 16 is a flowchart illustrating a control method of an electronic apparatus according to an embodiment.

FIG. 16 is a flowchart illustrating a control method of an electronic apparatus according to an embodiment of the disclosure.

In a control method of an electronic apparatus illustrated in FIG. 16, the electronic apparatus may include a panel device comprising a plurality of image display pixels and a plurality of image sensing elements, wherein each image sensing element is disposed between the plurality of image display pixels, an optical element disposed on an upper portion of the panel device, wherein the plurality of image sensing elements are configured to sense an incident light through the optical element, and a viewing zone adjusting assembly configured to adjust a field of view (FOV) of the plurality of image sensing elements.

According to the illustrated control method, first, the viewing zone adjusting assembly is controlled to adjust a FOV of at least one image sensing element (S1610). For example, in order to acquire a corresponding photographed image according to various user commands, the FOV of at least one image sensing element may be adjusted.

Next, the panel device is controlled to display an image generated based on the sensed incident light (S1620).

Here, each of the plurality of image sensing element may be implemented as a single sensing element or as a two-dimensional sensing element in the form of a macro pixel.

In addition, the plurality of image display pixels may be arranged in a two-dimensional form, and the plurality of image sensing elements may be arranged in a two-dimensional form in units of at least one image display pixel.

In addition, each of the plurality of image sensing elements may be disposed on the same layer as at least one image display pixel or disposed on a layer different from at least one image display pixel.

Meanwhile, the viewing zone adjusting assembly may include a liquid crystal shutter disposed on or below the optical element and constituted by a plurality of cells having a smaller size than that of the image sensing element. In this case, in S1610, an opening or closing operation of each of the plurality of cells may be controlled by controlling whether or not a voltage is applied to each of the plurality of cells constituting the liquid crystal shutter.

In addition, in S1610, a FOV of a display may be adjusted by adjusting at least one of an opening position or an opening size of the corresponding liquid crystal shutter based on an arrangement position of each of the optical lenses included in the optical element.

In addition, in S1610, when the FOV of the display is enlarged, the opening or closing operation of each of the plurality of cells may be controlled such that light is incident from the liquid crystal shutter corresponding to at least one sensing element disposed in an outer region to at least one cell region located at a first position. In addition, in S1610, when the FOV of the display is reduced, the opening or closing operation of each of the plurality of cells may be controlled such that the light is incident from the liquid crystal shutter corresponding to at least one sensing element disposed in the outer region to at least one cell region located at a second position.

Here, the optical element may include a plurality of liquid crystal lenses whose liquid crystal alignment angles change according to the intensity of the voltage, and the viewing zone adjusting assembly may include a voltage applier for applying the voltage to the optical element. The viewing zone adjusting assembly may include an optical element implemented as a liquid crystal lens and a voltage applier. In this case, in S1610, the voltage applier may be controlled to apply different voltages to each of the plurality of liquid crystal lenses based on the arrangement positions of the plurality of liquid crystal lenses, that is, the corresponding image sensing element.

In addition, in S1610, time division driving may be performed so that the plurality of image sensing elements are not driven during a first period in which the plurality of image display pixels are driven, and the plurality of image display pixels are not driven during a second period in which the plurality of image sensing elements are driven.

In addition, the control method may further include an operation of processing a plurality of images based on a FOV of each of the plurality of images acquired from the plurality of image sensing elements to acquire an output image to be displayed on the image display pixels.

In addition, in S1610, the viewing zone adjusting assembly may be controlled to differently adjust the FOV of the plurality of image sensing elements disposed at different arrangement positions according to a user command.

According to the various embodiments described above, by mounting the plurality of image sensing elements on the panel device, it is possible to reduce or prevent a gaze mismatch problem occurring during self-photographing or various interactions through self-photographing.

In addition, by embedding the image sensing elements in the display, a bezel of the display device may be minimized and ultimately a full screen display may be implemented.

In addition, because the focus of the image sensing element may be adjusted, an image photographed at an angle of view suitable for user interaction may be acquired.

In addition, the methods according to the various embodiments of the disclosure described above may be implemented by only upgrading existing hardware of the electronic apparatus, but in some cases, a software upgrade may be additionally required.

According to an embodiment, the various embodiments described above may be implemented by software including instructions that are stored in a machine (e.g., a computer-readable storage medium). The machine is a device that invokes the stored instructions from the storage medium and is operable according to the invoked instructions, and may include an image processing device (e.g., an image processing device A) according to the various embodiments. When the instructions are executed by the processor, the processor may perform functions corresponding to the instructions, either directly or using other components under the control of the processor. The instructions may include codes generated or executed by a compiler or an interpreter. The machine-readable storage medium may be provided in the form of a non-transitory storage medium. Here, the term 'non-transitory' means that the storage medium does not include a signal and is tangible, but does not distinguish whether data is stored semi-permanently or temporarily in the storage medium.

Each of the components (e.g., modules or programs) according to the various embodiments described above may include a single entity or a plurality of entities, and some sub-components of the sub-components described above may be omitted, or other sub-components may be further included in the various embodiments. Some components (e.g., modules or programs) may be integrated into one entity to perform the same or similar functions performed by the respective components prior to the integration. The operations performed by the module, the program, or other component, in accordance with the various embodiments may be performed in a sequential, parallel, iterative, or heuristic manner, or at least some operations may be executed in a different order or omitted, or other operations may be added.

Although the embodiments have been illustrated and described hereinabove, the disclosure is not limited to the abovementioned embodiments, but may be variously modified by those skilled in the art to which the disclosure pertains without departing from the gist of the disclosure as disclosed in the accompanying claims. These modifications should also be understood to fall within the scope and spirit of the disclosure.

What is claimed is:

1. An electronic apparatus comprising:
    a panel device comprising a plurality of image display pixels and a plurality of image sensing elements;
    an optical element disposed on an upper portion of the panel device, wherein the plurality of image sensing elements are configured to sense an incident light through the optical element;
    a viewing zone adjusting assembly configured to adjust a field of view (FOV) of the plurality of image sensing elements; and
    a processor configured to:
    control the viewing zone adjusting assembly to adjust an angle of the FOV of the plurality of image sensing elements, and
    control the panel device to display an image generated based on the sensed incident light,
    wherein each of the plurality of image sensing elements are disposed between each of the plurality of image display pixels, respectively, in a two-dimensional array,
    wherein the optical element comprises a plurality of liquid crystal lenses including liquid crystals,
    wherein the processor is further configured to:
    control the viewing zone adjusting assembly to differently adjust the angle of the FOV of the plurality of image sensing elements disposed at different arrangement positions based on a user command,
    wherein each of the plurality of image sensing elements is disposed on a different layer from the plurality of image display pixels,
    wherein the viewing zone adjusting assembly comprises a liquid crystal shutter disposed on or below the optical element, the liquid crystal shutter comprising a plurality of cells having a smaller size than that of the plurality of image sensing elements, wherein the processor is further configured to:
control an opening or closing operation of each of the plurality of cells by controlling whether or not a voltage is applied to each of the plurality of cells included in the liquid crystal shutter,
adjust a FOV of a display by adjusting at least one of an opening position or an opening size of the liquid crystal shutter based on an arrangement position of each of optical lenses included in the optical element,
control the opening or closing operation of each of the plurality of cells such that light is incident from the liquid crystal shutter corresponding to at least one image sensing element disposed in an outer region to at least one cell region located at a first position, when the FOV of the display is enlarged,
control the opening or closing operation of each of the plurality of cells such that the light is incident from the liquid crystal shutter corresponding to the at least one image sensing element disposed in the outer region to at least one cell region located at a second position, when the FOV of the display is reduced, the second position being different from the first position,
perform time division driving such that the plurality of image sensing elements are not driven during a first period in which the plurality of image display pixels are driven, and the plurality of image display pixels are not driven during a second period in which the plurality of image sensing elements are driven,
process a plurality of images based on a FOV of each of the plurality of images acquired from the plurality of image sensing elements to obtain an output image to be displayed on the plurality of image display pixels,
control the viewing zone adjusting assembly to adjust the FOV of the at least one image sensing element based on a distance of the at least one image sensing element with respect to a center of the panel device, and
increase the FOV of the at least one image sensing element as the distance with respect to the center of the panel device of the at least one image sensing element increases.

2. The electronic apparatus as claimed in claim 1, wherein the viewing zone adjusting assembly comprises a voltage applier configured to apply a voltage to the optical element,
wherein the processor is further configured to control the voltage applier to apply different voltages to each of the plurality of liquid crystal lenses based on arrangement positions of the plurality of liquid crystal lenses, and
wherein an angle of an alignment of the liquid crystals change based on an intensity of the voltage applied.

3. The electronic apparatus as claimed in claim 1, wherein the optical element is configured to disperse light emitted from the plurality of image display pixels.

4. The electronic apparatus as claimed in claim 1, wherein each of the plurality of image sensing elements is a single sensing element or a two-dimensional sensing element of a macro pixel form.

5. A control method of an electronic apparatus including a panel device comprising a plurality of image display pixels and a plurality of image sensing elements, an optical element disposed on an upper portion of the panel device, wherein the plurality of image sensing elements are configured to sense an incident light through the optical element, and a viewing zone adjusting assembly configured to adjust a field of view (FOV) of the plurality of image sensing elements, the control method comprising:
controlling the viewing zone adjusting assembly to adjust an angle of the FOV of the plurality of image sensing elements; and
controlling the panel device to display an image generated based on the sensed incident light,
wherein each of the plurality of image sensing elements are disposed between each of the plurality of image display pixels, respectively, in a two-dimensional array,
wherein the optical element comprises a plurality of liquid crystal lenses including liquid crystals,
wherein the controlling the viewing zone adjusting assembly comprises:
controlling the viewing zone adjusting assembly to differently adjust the angle of the FOV of the plurality of image sensing elements disposed at different arrangement positions based on a user command,
wherein each of the plurality of image sensing elements is disposed on a different layer from the plurality of image display pixels,
wherein the viewing zone adjusting assembly comprises a liquid crystal shutter disposed on or below the optical element, the liquid crystal shutter comprising a plurality of cells having a smaller size than that of the plurality of image sensing elements,
wherein the controlling the viewing zone adjusting assembly comprises:
controlling an opening or closing operation of each of the plurality of cells by controlling whether or not a voltage is applied to each of the plurality of cells included in the liquid crystal shutter,
adjusting a FOV of a display by adjusting at least one of an opening position or an opening size of the liquid crystal shutter based on an arrangement position of each of optical lenses included in the optical element,
controlling the opening or closing operation of each of the plurality of cells such that light is incident from the liquid crystal shutter corresponding to at least one image sensing element disposed in an outer region to at least one cell region located at a first position, when the FOV of the display is enlarged,
controlling the opening or closing operation of each of the plurality of cells such that the light is incident from the liquid crystal shutter corresponding to the at least one image sensing element disposed in the outer region to at least one cell region located at a second position, when the FOV of the display is reduced, the second position being different from the first position,
performing time division driving such that the plurality of image sensing elements are not driven during a first period in which the plurality of image display pixels are driven, and the plurality of image display pixels are not driven during a second period in which the plurality of image sensing elements are driven,
processing a plurality of images based on a FOV of each of the plurality of images acquired from the plurality of image sensing elements to obtain an output image to be displayed on the plurality of image display pixels,
controlling the viewing zone adjusting assembly to adjust the FOV of the at least one image sensing element based on a distance of the at least one image sensing element with respect to a center of the panel device, and
increasing the FOV of the at least one image sensing element as the distance with respect to the center of the panel device of the at least one image sensing element increases.

6. The control method as claimed in claim 5, wherein the viewing zone adjusting assembly comprises a voltage applier configured to apply a voltage to the optical element, and wherein in the controlling of the viewing zone adjusting assembly, the voltage applier is controlled to apply different voltages to each of the plurality of liquid crystal lenses based on arrangement positions of the plurality of liquid crystal lenses, and wherein an angle of an alignment of the liquid crystals change based on an intensity of the voltage applied.

\* \* \* \* \*